(12) United States Patent
Noguchi et al.

(10) Patent No.: US 6,323,525 B1
(45) Date of Patent: Nov. 27, 2001

(54) MISFET SEMICONDUCTOR DEVICE HAVING RELATIVE IMPURITY CONCENTRATION LEVELS BETWEEN LAYERS

(75) Inventors: Mitsuhiro Noguchi; Yukihito Oowaki, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/154,044

(22) Filed: Sep. 16, 1998

(30) Foreign Application Priority Data

Sep. 18, 1997 (JP) .................................................. 9-253869

(51) Int. Cl.$^7$ .......................... H01L 29/76; H01L 29/94; H01L 31/062; H01L 31/113; H01L 31/119
(52) U.S. Cl. .......................... 257/385; 257/394; 257/395; 257/344
(58) Field of Search .................. 257/385, 395, 257/394, 344, 408; 438/300, 301

(56) References Cited

U.S. PATENT DOCUMENTS

| | | | |
|---|---|---|---|
| 4,998,150 | * | 3/1991 | Rodder et al. ............ 357/23.1 |
| 5,093,275 | * | 3/1992 | Tasch, Jr. et al. ............ 437/41 |
| 5,925,913 | * | 7/1999 | Draper ............ 257/344 |
| 5,953,605 | * | 9/1999 | Kodama ............ 438/231 |
| 6,137,149 | * | 10/2000 | Kodama ............ 257/408 |

FOREIGN PATENT DOCUMENTS

| | | | | |
|---|---|---|---|---|
| 4-155840 | | 5/1992 | (JP) . | |
| 5-67785 | | 3/1993 | (JP) . | |
| 5-304264 | | 11/1993 | (JP) . | |
| 7-38095 | | 2/1995 | (JP) . | |
| 408018049A | * | 1/1996 | (JP) | ........................................ 29/78 |
| 8-49A | * | 1/1996 | (JP) | ........................................ 29/78 |
| 31-23140 | | 1/2001 | (JP) . | |

OTHER PUBLICATIONS

S. Nishimatsu et al., "Grooved Gate MOSFET", Japanese Journal of Applied Physics, 16(6–1) : 179–183 (1976).

R. Yan et al., "Scaling the Si MOSFET: from Bulk to SOI Bulk", IEEE Transactions on Electron Devices, 39(7) :1704–1710 (1992).

* cited by examiner

Primary Examiner—Steven Loke
Assistant Examiner—Douglas W. Owens
(74) Attorney, Agent, or Firm—Finnegan, Henderson, Farabow, Garrett & Dunner, L.L.P.

(57) ABSTRACT

A semiconductor device having a MISFET with an EV source/drain structure has a gate electrode formed on part of a first p-type semiconductor layer via a gate insulating film. A second n$^+$-type semiconductor layer is formed in the prospective source and drain regions of the first semiconductor layer via the gate electrode, and a third n$^-$-type semiconductor layer is formed on the second semiconductor layer. Each of source and drain regions is formed from the second and third semiconductor layers. The upper edge of the source/drain regions is formed above the boundary between the first semiconductor layer and the gate insulating film. In an ON state, part of a depletion layer in the drain region is formed in the third semiconductor layer, and part of a depletion layer in the source region is formed in the second semiconductor layer.

25 Claims, 15 Drawing Sheets

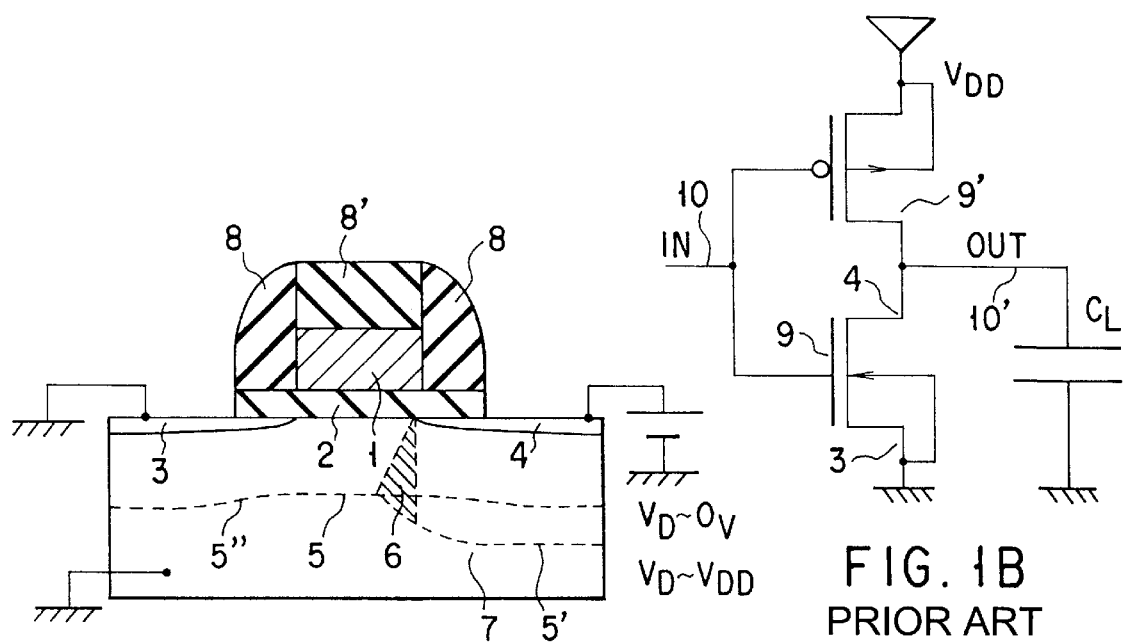
FIG. 1A PRIOR ART
FIG. 1B PRIOR ART
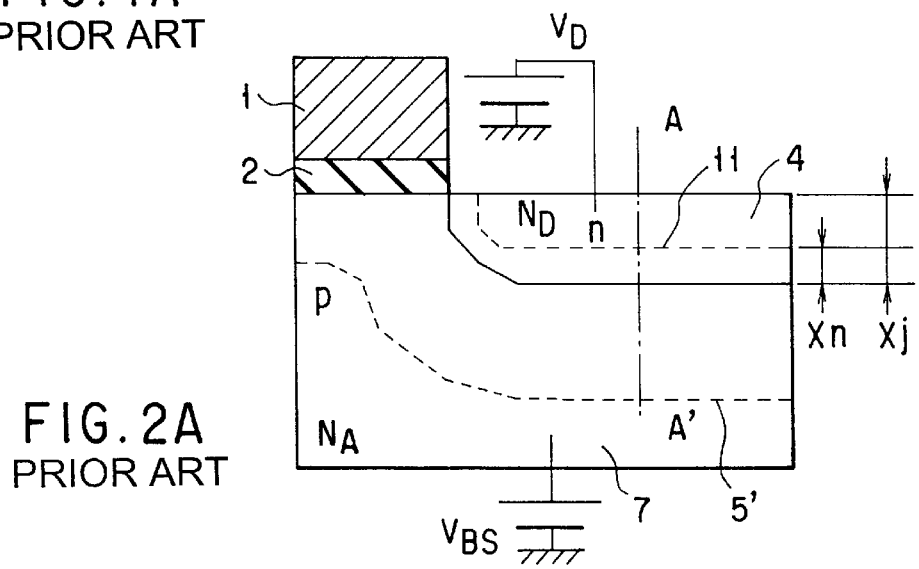
FIG. 2A PRIOR ART
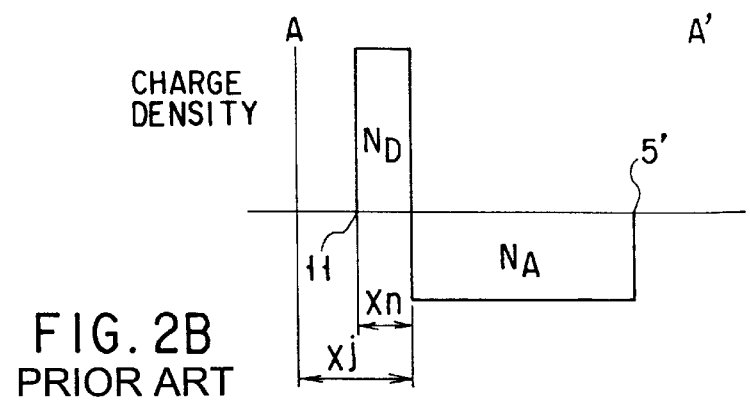
FIG. 2B PRIOR ART

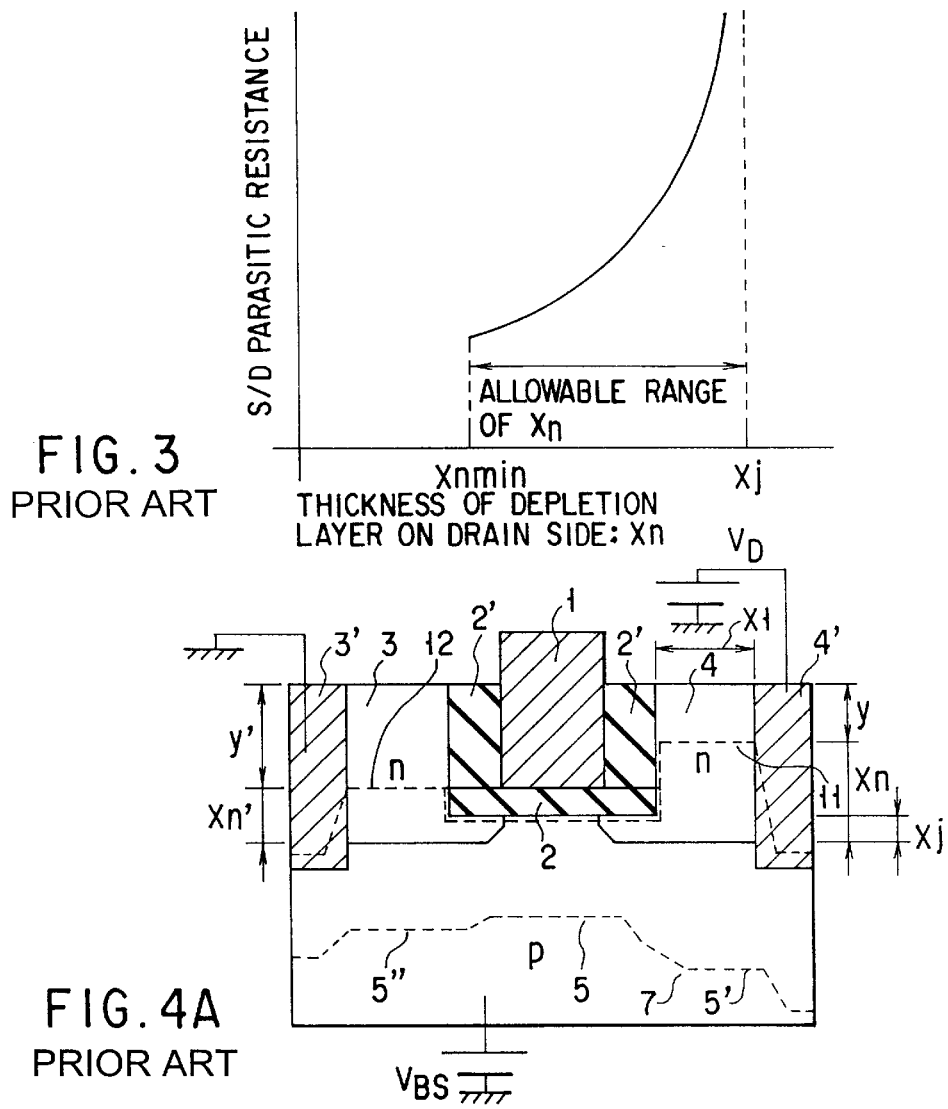
FIG. 3 PRIOR ART
FIG. 4A PRIOR ART
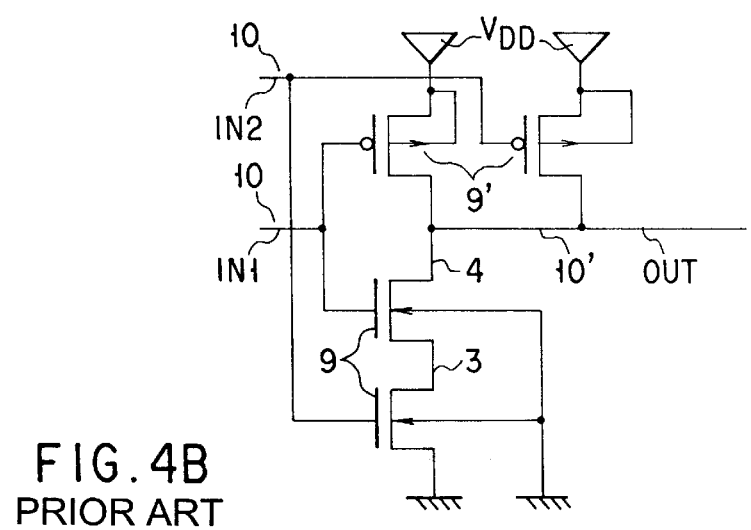
FIG. 4B PRIOR ART

MISFET SEMICONDUCTOR DEVICE HAVING RELATIVE IMPURITY CONCENTRATION LEVELS BETWEEN LAYERS

BACKGROUND OF THE INVENTION

The present invention relates to a semiconductor device having a MISFET and, more particularly, to a semiconductor device having a structure in which part of the source/drain regions is formed above the interface between the substrate and the gate insulating film.

MISFETs suffer a phenomenon, i.e., so-called DIBL (Drain Induced Barrier Lowering) that the threshold voltage drops upon application of the drain voltage. This will be briefly explained using an n-type MISFET in FIG. 1A.

In FIG. 1A, a polysilicon gate electrode 1 doped with B, As, or P is formed via a gate insulating film 2 made of a silicon oxide film on an Si semiconductor layer 7 for forming a channel region. Source and drain regions 3 and 4 of a conductivity type opposite to that of the semiconductor layer 7 are formed on the two sides of the gate electrode 1 by ion-implanting P or As. Insulating films 8 are formed on the two sides of the gate electrode 1, whereas an insulating film 8' is formed on top of the gate electrode 1.

Assume that the drain region 4 receives a higher voltage than that for the source region 3. This is the case wherein the n-type MISFET is used to form, e.g., a logic circuit for a static inverter in FIG. 1B. In FIG. 1B, the gate electrode of an n-type MISFET 9 is connected to the gate electrode of a p-type MISFET 9' to form an input electrode 10 of the inverter. The drain 4 of the n-type MISFET 9 is connected to the drain 4 of the p-type MISFET 9' to form an output 10' of the inverter. The source 3 of the n-type MISFET 9 is grounded (0V), and the source of the p-type MISFET 9' is connected to a power supply terminal ($V_{DD}$). In this manner, a static inverter is constructed.

When a logic circuit is formed using an n-type MISFET, like this inverter, the voltage applied to the p-n junction between the drain and the substrate is higher than the voltage applied to the p-n junction between the source and the substrate. For this reason, as shown in FIG. 1A, a substrate-side edge 5' of a depletion layer formed by the p-n junction between the drain and the substrate extends to the semiconductor layer 7 much more than a substrate-side edge 5" of the depletion layer defined by the p-n junction between the source and the substrate. That region (charge share region) 6 of the depletion layer, which is below the gate electrode and shared by a drain depletion layer, widens when the drain voltage increases. As a result, the depletion layer that can be controlled by the gate narrows. As the negative charges contained in the gate-controlled depletion layer decrease, the threshold voltage of the transistor lowers. Accordingly, the threshold voltage drops upon application of the drain voltage.

This phenomenon is so-called DIBL. Since the ratio of the charge share region 6 to the overall depletion layer below the gate electrode increases with a decrease in gate length, the drop in threshold voltage becomes prominent as the gate length becomes shorter.

To suppress widening of the charge share region upon application of the drain voltage, it has been found effective to extend the depletion layer to the drain region upon application of the drain voltage and as a result, suppress substrate-side widening of the depletion layer formed in the semiconductor layer 7. However, when this method is adopted in a simple drain structure in which the drain is formed nearer the substrate than the interface between the substrate and the gate insulating film, the parasitic resistance of the drain increases undesirably. This will be explained using a uniformly doped drain structure in FIGS. 2A and 2B.

FIG. 2A is an enlarged sectional view showing the drain and the substrate when voltages $V_{BS}$ and $V_D$ are respectively applied to the substrate electrode and the drain. Donors are uniformly doped in the drain region 4 at an impurity concentration $N_D$, and acceptors are uniformly doped in the semiconductor layer 7 at an impurity concentration $N_A$. In this case, using depletion approximation with reference to a charge distribution shown in FIG. 2B corresponding to the section taken along the line A–A' in FIG. 2A, a distance $X_n$ from the boundary between the drain region 4 and the semiconductor layer 7 to the edge of the depletion layer extending to the drain region is given by:

$$X_n = \{2\epsilon_S(V_D + V_{BI} - V_{BS})/q\}^{0.5} \times \{N_A/N_D/(N_A + N_D)\}^{0.5} \quad (1)$$

where $\epsilon_S$ is the dielectric constant of the semiconductor, and q is the elementary charge, $V_{BI}$ is the built-in voltage.

From equation (1), $X_n$ monotonically decreases with increasing $N_D$. The upper limit of the impurity amount which can be doped to the semiconductor is determined by the solid solubility limit. Letting $N_{Dmax}$ be the upper limit of the donor impurity amount, the lower limit $X_{nmin}$ of $X_n$ is given from equation (1) by:

$$X_{nmin} = \{2\epsilon_S(V_D + V_{BI} - V_{BS})/q\}^{0.5} \times \{N_A/N_{Dmax}/(N_A + N_{Dmax})\}^{0.5} \quad (2)$$

Further, when y represents the drain length, W represents the channel width, $X_j$ represents the formation depth of the drain region in FIG. 2A, and ρ represents the resistivity, the resistance R of the drain is $$R = y\rho/\{W(X_j - X_n)\} \quad (3)$$

Since ρ monotonically increases with $N_D$, the relation of R for $X_n$ shown in FIG. 3 can be obtained using equations (2) and (3). From equation (2), as $X_n$ comes closer to $X_j$, R diverges infinitely. That is, when $X_n$ is increased to suppress widening of the charge share region by extending the depletion layer to the drain region, the resistance of the drain increases infinitely if $X_j$ remains constant. From equation (2), since $X_{nmin}$ is a constant that is determined regardless of $X_j$, the allowable range of $X_n$ narrows with decreasing $X_j$. If $X_n$ varies due to variations in impurity concentration and defect distribution, the parasitic resistance of the drain also varies. Consequently, the drivability varies between devices, and thus the delay time of the logic circuit varies, which makes it difficult to design a high-speed optimum operation.

According to the study made by the present inventors, such an increase in parasitic resistance can be effectively prevented by a so-called elevated (to be referred to as EV hereinafter) source/drain structure like the one shown in FIG. 4A in which at least part of the source/drain regions is formed above the interface between the substrate and the gate insulating film. This EV source/drain structure itself is described in, e.g., S. Nishimatsu, Y. Kawamoto, H. Masuda, R. Hori, and O. Minato, "Grooved Gate MOSFET", Jpn, J. Appl. Phys., 16; Suppl. 16-1, 179 (1977).

The structure in FIG. 4A is basically the same as that in FIG. 1A except that the source and drain regions 3 and 4 are formed above the interface between the semiconductor layer 7 and the gate insulating film 2. A source contact formation region 3' and a drain contact formation region 4' are respectively formed $X_1$ apart from gate insulating film 2' in the source region 3 and the drain region 4. The broken lines in FIG. 4A indicate the edges of a depletion layer formed in the source and drain regions 3 and 4 and the semiconductor layer 7. The thickness of the gate insulating film 2 between the gate electrode 1 and the semiconductor layer 7 is equal to or smaller than the thickness of a gate insulating film 2' between the gate electrode 1 and the source region 3.

In the EV source/drain structure, letting y be the distance from the upper surface of the doped drain layer to the depletion layer, W be the channel width, $X_1$ be the length of the drain region 4 measured from the drain contact region 4', and ρ be the resistivity, as shown in FIG. 4A, the parasitic resistance R from the upper edge of the drain to an edge 11 of the depletion layer in the drain region is $$R = \rho X_1 / (Wy) \quad (4)$$

From equation (4), unlike equation (3), the resistance R per unit width W can be reduced by increasing the height y of the drain region 4 or decreasing $X_1$. This resistance R is not a function of the depth $X_j$ of the source/drain regions 3 formed in the semiconductor layer 7, and thus can be kept small even if $X_j$ is decreased to almost 0 nm.

In the conventional EV source/drain structure in FIG. 4A, the impurity concentration of the source/drain is constant or increases upward in the gate stacking direction from the substrate to the interface of the depletion layer. In this EV source/drain structure, if $X_n$ is increased to reduce the charge share, the current drivability structurally greatly lowers.

In FIG. 4A, the voltage $V_{BS}$, the voltage $V_D$, and 0V are respectively applied to a substrate electrode, the drain region 4, and the source region 3. Donors are uniformly added to the source and drain regions 3 and 4 at an impurity concentration $N_D$, and acceptors are uniformly added to the semiconductor layer 7 at an impurity concentration $N_A$. In this case, the distance $X_n$ from the boundary between the drain region 4 and the semiconductor layer 7 to the edge of the depletion layer extending to the drain region can be given using depletion approximation by:

$$X_n = \{2\epsilon_S(V_D+V_{BI}-V_{BS})/q\}^{0.5} \times \{N_A/N_D/(N_A+N_D)\}^{0.5}$$

$$dX_n/dV_D = \epsilon_S/q \cdot \{2\epsilon_S(V_D+V_{BI}-V_{BS})/q\}^{-0.5} \times \{N_A/N_D/(N_A+N_D)\}^{0.5} \quad (5)$$

From equation (5), the rate of change of $X_n$ with respect to $V_D$ decreases with increasing $V_D$. The change amount of $X_n$ at a drain voltage in the neighborhood of 0V is larger than the change amount of $X_n$ at a higher drain voltage.

This feature becomes more noticeable in a structure in which the impurity concentration of the source/drain increases upward in the gate stacking direction from the substrate to the interface of the depletion layer. In this structure, $N_D$ in equation (5) is effectively higher for higher $V_D$ than for lower $V_D$. As described with reference to equation (3), if $X_n$ varies due to variations in impurity concentration and defect distribution, the parasitic resistance of the drain also varies, and the drivability varies between devices, which makes it difficult to design a high-speed optimum operation.

Further, the source region generally has the same structure as that of the drain region. In this case, a distance $X_n'$ from the boundary between the source region 3 and the semiconductor layer 7 to the edge of the depletion layer extending to the source region can be given using depletion approximation by:

$$X_n' = \{V_{BI}-V_{BS}\}/(V_D+V_{BI}-V_{BS})\}^{0.5} X_n \quad (6)$$

From equation (6), $X_n'$ is proportional to $X_n$.

When, therefore, the source region has the same structure as that of the drain region, if $X_n$ is increased to reduce the charge share of the drain region, the width $X_n'$ of the depletion layer at the source edge inevitably increases. From equation (6), when the voltage of the drain region is higher than the voltage of the source region, the change amount of the source region $X_n'$ with the source voltage is larger than the change amount of the drain region $X_n$ with the drain voltage. At a source voltage of approximately 0V, the position of the edge of the depletion layer in the source region greatly changes depending on the source voltage.

For example, in a static NAND logic circuit shown in FIG. 4B, when the source region of the n-type MISFET 9 is connected to the drain region of another n-type MISFET 9, the source voltage of the transistor series-connected to the source region 3 side rises owing to the drain/source resistance and channel resistance of the transistor. As a result, the width $X_n'$ of the depletion layer increases, and an edge 12 of the depletion layer which actually serves as the edge of the source region in FIG. 4A recedes from the interface between the gate insulating film 2 and the semiconductor layer 7. For this reason, the charge amount injected from the source edge decreases to lower the current drivability.

Particularly in the EV source/drain structure like the one in FIG. 4A in which the source/drain regions are formed above the interface between the substrate and the gate insulating film, since the source-region-side edge 12 of the depletion layer is formed above the interface between the semiconductor layer 7 and the gate insulating film 2, the current drivability remarkably lowers. This is because a so-called edge effect inhibits electric field from reaching the portions near the corners defined by the bottom and side surfaces of the gate electrode 1, and an inversion layer is hard to form at the corners.

As described above, in the MISFET structure in FIG. 1A, the drain voltage dependence of the threshold voltage due to DIBL cannot be reduced, and stable current drivability cannot be maintained by keeping the parasitic resistance of the source region small. In the EV source/drain structure in FIG. 4A, the current drivability lowers upon an increase in source voltage.

BRIEF SUMMARY OF THE INVENTION

It is an object of the present invention to provide a semiconductor device having an EV source/drain structure in which DIBL in a MISFET is suppressed, and stable current drivability is ensured.

According to the first aspect of the present invention, there is provided a semiconductor device having a MISFET, the MISFET comprising: a first semiconductor layer of a first conductivity type for forming a channel region; a gate electrode facing the channel region via a gate insulating film; a second semiconductor layer of a second conductivity type formed in each of source and drain regions so as to be in contact with the first semiconductor layer; a third semiconductor layer formed on the second semiconductor layer in the drain region, the second semiconductor layer being sandwiched between the first and third semiconductor layers; and first and second main electrodes respectively connected to the source and drain regions. In this case, an upper edge of the third semiconductor layer is formed above a boundary between the first semiconductor layer and the gate insulating film. A value obtained by subtracting a concentration of a first conductivity type impurity from a concentration of a second conductivity type impurity in the second semiconductor layer is set larger than a value obtained by subtracting the concentration of the first conductivity type impurity from the concentration of the second conductivity type impurity in the third semiconductor layer. In an ON state, a depletion layer in the drain region is formed to extend into the third semiconductor layer, and a depletion layer in the source region is formed to extend into the second semiconductor layer.

According to the second aspect of the present invention, there is provided a semiconductor device comprising a MISFET, the MISFET having: a first layer of semiconductor of a first conductivity type for forming a channel region; a gate electrode facing the channel region via a gate insulating film; a second layer of semiconductor of a second conductivity type formed in each of source and drain regions so as to be in contact with the first layer; a third layer formed on the second layer in each of the source and drain regions, the second layer being sandwiched between the first and third layers; and first and second main electrodes respectively connected to the source and drain regions. In this case, an upper edge of the third layer is formed above a boundary between the first layer and the gate insulating film. The third layer has a smaller number of second conductivity type carriers than that of the second layer in thermal equilibrium. In an ON state, a depletion layer in the drain region is formed to extend into the third layer, and a depletion layer in the source region is formed to extend into the second layer.

Further, according to the present invention, there is provided a method of manufacturing a semiconductor device using a MISFET with an EV source/drain structure, comprising the steps of forming a gate electrode on part of a first semiconductor layer of a first conductivity type via a gate insulating film, forming a sidewall insulating film on a side of the gate electrode, forming a heavily doped second semiconductor layer of a second conductivity type on the first semiconductor layer, and forming a lightly doped third semiconductor layer of the second conductivity type on the second semiconductor layer.

According to the present invention, in the EV source/drain structure, the drain of the MISFET is formed from the second semiconductor layer as a heavily doped layer, and the third semiconductor layer as a lightly doped layer stacked on it, and the source is formed from only the second semiconductor layer or both the second and third semiconductor layers, thereby reducing the drain voltage dependence of the threshold voltage attributed to DIBL. Since the effective channel length decreases upon an increase in drain voltage, any increase in drain current in a saturated region can be suppressed. When this MISFET is used as a current source or a current limiter, a stable current output can be obtained.

For a low drain voltage, the position of the edge of the drain region in the channel can be determined with high precision, and the current drivability can be stably attained. Since the ratio of the channel depletion layer that is shared by the drain region is small, a threshold voltage drop caused by the short channel effect hardly occurs even upon a decrease in channel length.

Since part of the depletion layer in the drain region is formed in the third semiconductor layer, widening of the depletion layer extending to the substrate on the drain region side can be suppressed. This prevents punch-through between the source and drain when the drain voltage rises. Since part of the depletion layer in the source region is formed in the second semiconductor layer, the parasitic resistance of the source region can be kept small, and high current drivability can be maintained. Even if the source voltage rises, any change at the edge of the source depletion layer is small, and stable current drivability can be attained. Further, even if the source and drain are formed symmetrically, sufficient current drivability can be maintained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are a sectional view showing a MISFET structure of a related art, and a circuit diagram showing a MIS static inverter, respectively;

FIGS. 2A and 2B are a sectional view showing the drain of the MISFET in FIG. 1A, and a graph showing the charge density distribution, respectively;

FIG. 3 is a graph showing the relationship between the thickness of the depletion layer in the drain region and the S/D parasitic resistance;

FIGS. 4A and 4B are a sectional view showing a MISFET having an EV source/drain structure of another related art, and a circuit diagram showing a static NAND logic circuit, respectively;

DETAILED DESCRIPTION OF THE INVENTION

Embodiments of the present invention will be described below with reference to the several views of the accompanying drawing.

FIRST EMBODIMENT

Figure 5:
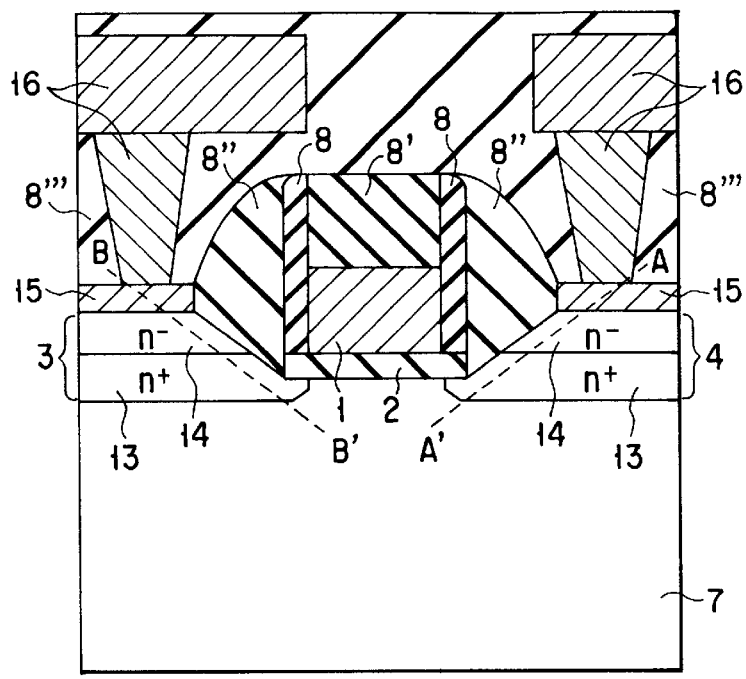
FIG. 5 is a sectional view showing an n-type MISFET according to the first embodiment.

FIG. 5 is a sectional view showing an n-type MISFET according to the first embodiment of the present invention.

The first embodiment is different from the device shown in FIG. 4A in the structure of a drain region 4. More specifically, the drain region 4 in FIG. 5 is formed by stacking a donor-doped semiconductor layer (second semiconductor layer) 13 heavily doped with an n-type impurity, and a doped semiconductor layer (third semiconductor layer) 14 lightly doped with an n-type impurity from the side near the channel region. The semiconductor layer 14 need not always be of n-type as far as the value obtained by subtracting the acceptor impurity concentration from the donor impurity concentration in the semiconductor layer 13 is larger than the value obtained by subtracting the acceptor impurity concentration from the donor impurity concentration in the semiconductor layer 14. In other words, in the semiconductor layer 14, the number of n-type carriers, i.e., electrons in thermal equilibrium must be smaller than the number of electrons in the semiconductor layer 13. Furthermore, in other words, the semiconductor layer 14 must have a potential for n-type carriers, i.e., electrons higher than that of the semiconductor layer 13, in thermal equilibrium. In this case, the layer 14 does not have to be formed of semiconductor doped with impurity, but may be formed of conductor having a potential for n-type carriers higher than that of the layer 13, in thermal equilibrium.

To suppress DIBL, it is desirable that a value obtained by subtracting the concentration of the first conductivity type impurity from the concentration of the second conductivity type impurity in the third semiconductor layer is smaller than a value obtained by subtracting the concentration of the second conductivity type impurity from the concentration of the first conductivity type impurity in the first semiconductor layer.

In a region above the donor-doped semiconductor layer 14 where no insulating film 8" is formed on the gate side portion, a donor-doped semiconductor layer (fourth semiconductor layer) doped with, e.g., P or As, or a TiSi or CoSi conductive layer 15 is formed. The conductive layer 15 has a resistivity lower than that of the layer 14. When the layer 15 is a semiconductor layer, the value obtained by subtracting the concentration of the first conductivity type impurity from the concentration of the second conductivity type impurity in the layer 15 is set higher than the value obtained by subtracting the concentration of the first conductivity type impurity from the concentration of the second conductivity type impurity in the semiconductor layer 14. An electrode interconnection layer 16 made of P- or B-doped polysilicon, WSi, TiSi, Ru, Pt, Al, Cu, or W is formed on the conductive layer 15. In this case, a semiconductor layer (first semiconductor layer) 7 for forming a channel region is desirably a single-crystal layer.

A process of manufacturing the semiconductor structure of the first embodiment will be described with reference to FIGS. 6A to 6D.

First, a semiconductor substrate on which a p-type layer having, e.g., a boron concentration of $10^{15}$ cm$^{-3}$ is formed is prepared. The concentration of the p-type semiconductor region 7 may be optimized by ion-implanting and diffusing boron or indium in the region 7 at about $10^{12}$ to $10^{15}$ cm$^{-2}$. The ion implantation energy is set at, e.g., 100 eV to 1,000 eV. The concentration of the well region is preferably set at $10^{15}$ cm$^{-3}$ to $10^{19}$ cm$^{-3}$. Although not shown, e.g., element isolation such as trench isolation is formed. After that, the concentration of the region 7 may be optimized by ion-implanting and diffusing boron or indium in the p-type semiconductor layer 7.

The surface of the semiconductor layer 7 is oxidized or nitrided, e.g., 3 to 100 nm to form a gate insulating film 2. A polysilicon film serving as a gate electrode 1 is deposited to, e.g., 10 to 200 nm on the entire surface, and decreased in resistance by ion-implanting phosphorus, arsenic, or boron. Further, e.g., WSi, CoSi, W, or Al may be deposited to, e.g., 10 to 200 nm on the entire surface in order to decrease the resistance of the gate electrode. A silicon oxide film or silicon nitride film serving as an insulating film 8' is deposited to, e.g., 2 to 200 nm on the entire surface and processed into a gate electrode 1 by lithography and reactive ion etching. The insulating film 8' is used to prevent short-circuiting between the gate and the source/drain during formation of a contact, and need not always be formed.

Figure 6A:
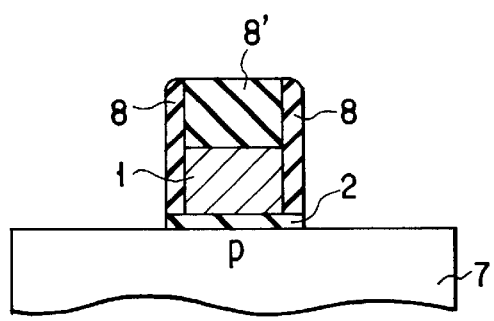
FIGS. 6A to 6D are sectional views, respectively, showing the steps in manufacturing the MISFET according to the first embodiment.

Then, e.g., a silicon oxide film or silicon nitride film is deposited to 2 to 200 nm on the entire surface and processed into a sidewall insulating film 8 on the steep sidewall of the gate electrode 1 by anisotropic etching, thereby obtaining a shape shown in FIG. 6A. The sidewall insulating film 8 and the insulating film 8' deposited immediately before lithography surround the gate electrode 1 to easily maintain electrical insulation between the gate electrode 1 and the source/drain regions.

Figure 6B:
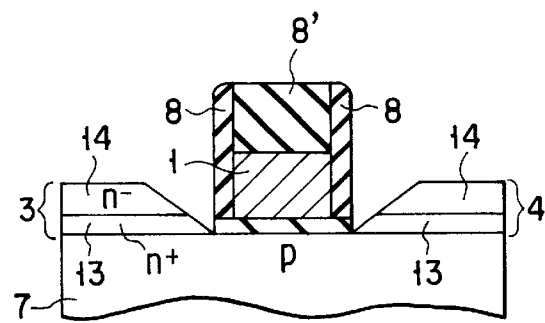

As shown in FIG. 6B, semiconductor layers 13 and 14 having a thickness of, e.g., 5 to 500 nm are formed by selective epitaxial growth using, e.g., Si, an SiGe mixed crystal, or an SiGeC mixed crystal accompanied by doping. That is, a donor-doped semiconductor layer 13 having a thickness of about 0.5 to 10 nm is grown by doping, e.g., As. Sb, or P at $10^{18}$ to $10^{21}$ cm$^{-3}$. A doped semiconductor layer 14 having a thickness of about 4.5 to 490 nm is grown by optimizing the impurity concentration to $10^{16}$ to $10^{18}$ cm$^{-3}$.

In this case, the semiconductor layer 13 may be formed by adsorbing, e.g., AsH$_3$, PH$_3$, or Sb in the surface of the semiconductor layer 7 and selectively epitaxially growing, e.g., Si, an SiGe mixed crystal, or an SiGeC mixed crystal. The semiconductor layer 14 may be formed by out-diffusion from the doped layer 13 instead of performing this impurity doping process.

If the semiconductor substrate has a {100} plane, and the gate is patterned parallel to the <100> direction, a {311} plane can be formed along the gate sidewall where the source and drain regions 3 and 4 are separated more from the gate sidewall 8 toward the upper side, as shown in FIG. 6B. In this case, the capacitance between the gate and source, and the capacitance between the gate and drain can be kept small.

Figure 6C:
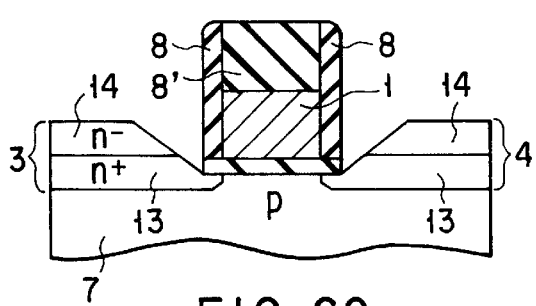
Figure 6D:
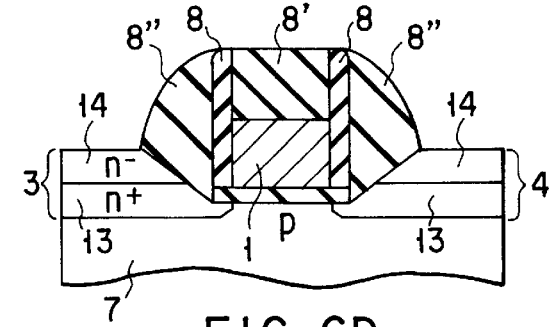

As shown in FIG. 6C, the doped semiconductor layer 13 may be extended by diffusion in the semiconductor layer 7 by heating the resultant structure, e.g., in Ar or N$_2$ atmosphere at 700 to 1,100° C. for 0.01 to 60 sec. The diffusion time is typically the time until the layer 13 is formed below the gate sidewall insulating film 8.

Figure 7:
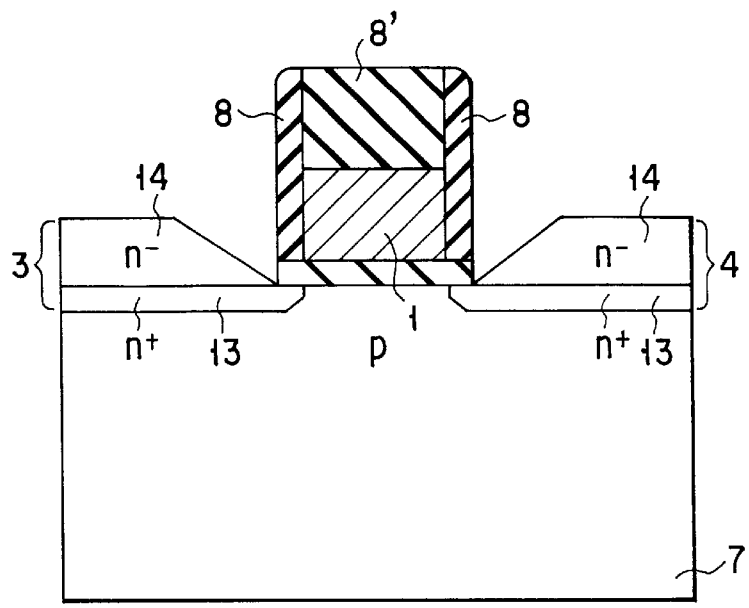
FIG. 7 is a sectional view showing a modification of the step in manufacturing the MISFET according to the first embodiment.

As another process of forming the semiconductor layers 13 and 14, a semiconductor layer 13 may be formed by ion-implanting, e.g., As, P, or Sb at an acceleration voltage of 1 to 100 eV and a dose of $10^{13}$ to $10^{16}$ cm$^{-2}$ after the step in FIG. 6A, and a semiconductor layer 14 having a structure shown in FIG. 7 may be formed by selective epitaxial growth.

Next, e.g., a silicon oxide film or silicon nitride film is deposited to 2 to 200 nm on the entire surface. A silicon oxide film or silicon nitride film is deposited to 2 to 200 nm on the entire steep sidewall of the sidewall insulating film 8 and processed into a sidewall insulating film 8" by anisotropic etching, thereby obtaining a shape in FIG. 6D. This insulating film is used to prevent point defects and impurity diffusion produced in the subsequent step of forming the conductive layer 15 from deteriorating the crystal quality below the gate electrode 1.

Thereafter, although not shown, lithography may be performed, and an n-type impurity such as arsenic or phosphorus may be ion-implanted at an acceleration voltage of 1 to 30 eV and a dose of $10^{13}$ to $10^{16}$ cm$^{-2}$ to increase the concentration of the semiconductor layer 14 not covered with the gate sidewall insulating film 8'''. Silicide or metal layers are selectively formed on the source and drain regions 3 and 4 to obtain conductive layers 15. The conductive layers 15 are formed such that, e.g., Co or Ti is deposited to 0.01 to 0.3 μm on the entire surface and annealed at 600° C. or more to selectively form CoSi or TiSi layers on the source and drain regions 3 and 4, and the remaining metal is selectively etched away with, e.g., a solution mixture of sulfuric acid and hydrogen peroxide.

After an interlevel insulating film 8''' made of, e.g., silicon oxide, PSG, or BPSG is deposited to, e.g., 20 to 1,000 nm, wiring contacts are formed by lithography and reactive ion etching, and a silicide such as TiSi or WSi or a metal such as Al, Cu, or W is deposited to form upper electrode interconnection layers 16, thereby completing a semiconductor structure.

Figure 8:
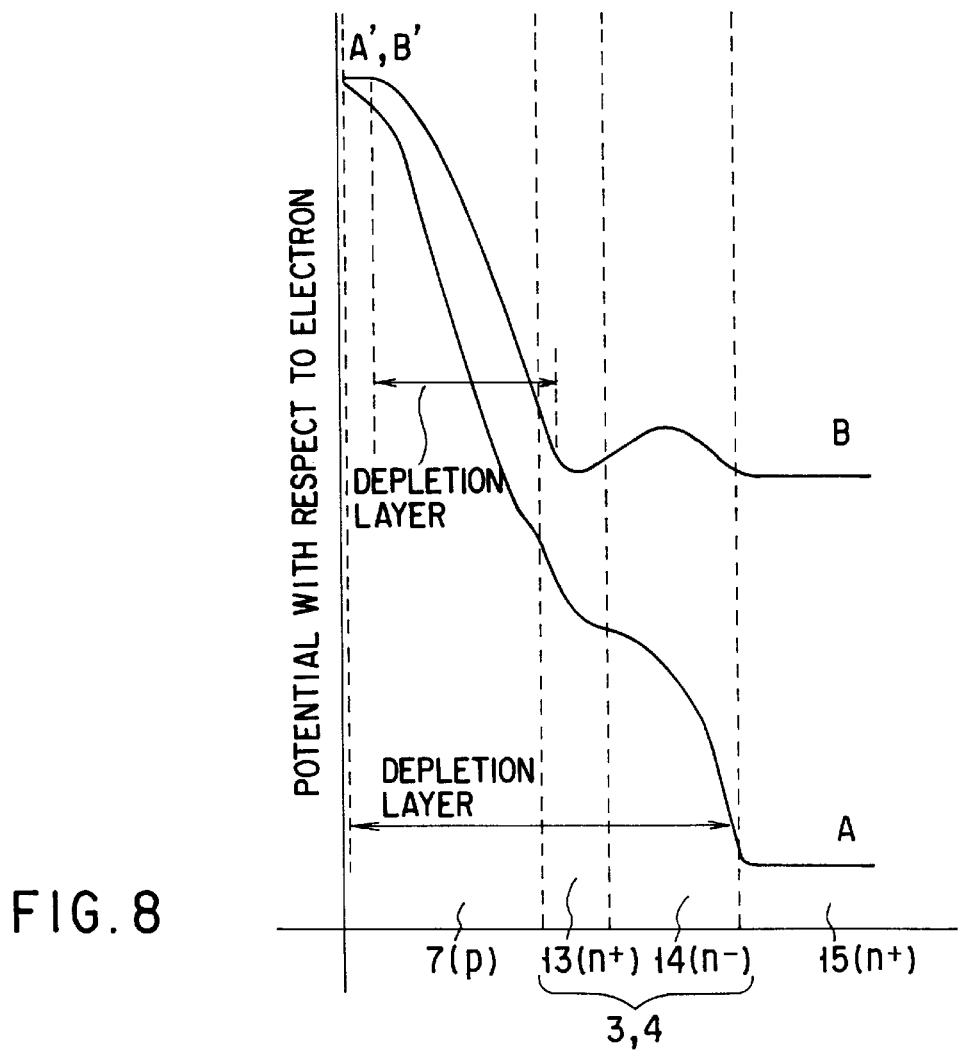
FIG. 8 is a graph showing the potential distributions in sections taken along the lines A–A' and B–B' in the structure of FIG. 5.

FIG. 8 shows the potential distributions in sections taken along the lines A–A' and B–B'. When, e.g., a drain voltage $V_{DD}$ of the same order of the built-in voltage is applied, the depletion layer between the drain region 4 and the semiconductor layer 7 extends to the semiconductor layer 14 of the drain region 4, as shown in FIG. 8. Since the donor concentration of the layer 14 (n$^-$-type portion) is lower than that of the layer 13 (n$^+$-type portion), the voltage drop in the drain region 4 is larger, compared to the case in which the layer 14 has the same concentration as that of the layer 13. The voltage drop in the depletion layer in the p-type portion 7 and the n$^+$-type portion 13 in the semiconductor substrate along the line A–A' is smaller, compared to the case in which the layer 14 has the same concentration as that of the layer 13. As a result, the drain depletion layer formed in the semiconductor layer 7 becomes shallower, compared to the case in which the depletion layer does not reach the portion 14 in a conventional source/drain structure.

On the other hand, in a source region, a potential distribution along the line B–B' in FIG. 8 can be obtained. Further, when the applied drain voltage is much lower than the built-in voltage, a potential distribution along the line A–A' is the same as the potential distribution along the line B–B' in FIG. 8. In this case, the depletion layer stops at the donor-doped semiconductor layer 13 and does not reach the doped semiconductor layer 14. For this reason, when a low drain voltage is applied, a wide n$^-$-type portion 14 which is not depleted can be used as a conductive layer, and the parasitic resistance between the source and drain can be kept low.

Since the impurity concentration of the layer 13 is higher than that of the layer 14, the change rate of spread of the widening drain depletion layer with respect to the drain voltage can be kept small for a low drain voltage, compared to the case in which the source/drain regions are formed at only the impurity concentration of the n$^-$-type portion 14. When the source region is formed with the same structure as that of the drain region, the position of the source-region-side edge of the channel region can be determined with high precision. Even if the source voltage rises, stable current drivability can be attained.

To stimulate widening of the depletion layer for a high drain voltage and suppress it for a low drain voltage, the impurity concentration of the semiconductor layer 7 is desirably set lower than that of the n$^+$-type portion 13 and higher than that of the n$^-$-type portion 14.

Figure 9:
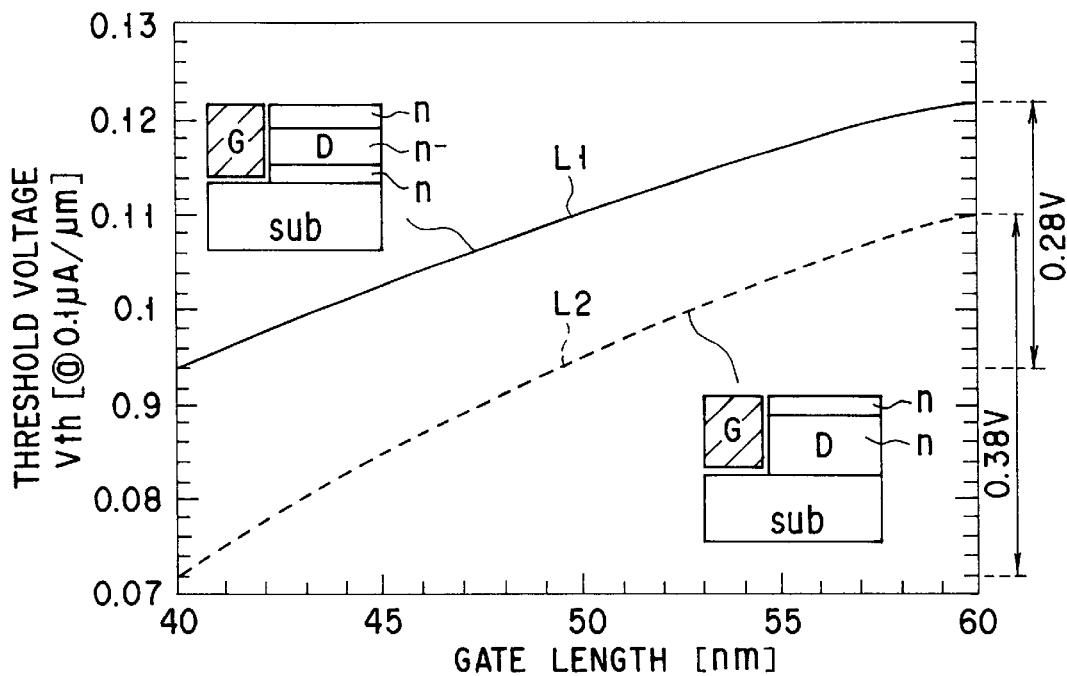
FIG. 9 is a graph showing a decrease in short channel effect in the first embodiment in comparison with a related art.

FIG. 9 is a graph showing a comparison of the threshold voltage as a function of the gate length, i.e., the short channel effect between the case wherein a voltage is applied to the drain region in the EV source/drain structure of the first embodiment and the case wherein a voltage is applied to the drain region in a conventional EV source/drain structure. The solid line L1 represents the characteristics of the EV source/drain structure of the first embodiment in which the layer 13 of the source/drain regions has a thickness of 2 nm and an n-type impurity concentration of $1\times10^{19}$ cm$^{-3}$, the layer 14 has a thickness of 15 nm and an n-type impurity concentration of $3\times10^{16}$ cm$^{-3}$, and another n-type semiconductor layer having a thickness of 3 nm and an n-type impurity concentration of $5\times10^{19}$ cm$^{-3}$ is further formed on the layer 14.

For a comparison purpose, the dotted line L2 represents the characteristics of the conventional EV source/drain structure in which a layer having a uniform impurity concentration of $1\times10^{19}$ cm$^{-3}$ equal to that of the layer 13, and a thickness of 17 nm, is used instead of the n$^+$-type portion 13 and the n⁻-type portion 14. Also in the conventional structure, an n-type semiconductor layer having a thickness of 3 nm and an n-type impurity concentration of $5 \times 10^{19}$ cm$^{-3}$ is formed on the layer having a uniform impurity concentration of $1 \times 10^{19}$ cm$^{-3}$ and a thickness of 17 nm.

In this case, a drain voltage of 1V and source and substrate voltages of 0V are applied. As is apparent from FIG. 9, in the structure of the first embodiment, threshold voltage drops upon a decrease in gate length can be suppressed within around 75% the drop in the conventional EV source/drain structure formed at a uniform concentration.

The depth change of the depletion layer formed in the semiconductor portion 7 upon application of a high or low drain voltage can be kept small to suppress DIBL, compared to the case in which no heavily doped portion like the conventional portion 13 is formed. Accordingly, threshold voltage drops can be prevented even upon application of the drain voltage, and an increase in sub-threshold leakage current resulting from DIBL upon application of the drain voltage can be prevented. In a saturated portion, an increase in drain current due to a short effective channel length upon an increase in drain voltage can be suppressed. When this MISFET is used for a current source or a current limiter, a stable current output having little independence on the drain voltage can be obtained.

Since the ratio of the depletion layer in the substrate formed by the gate that is shared by the drain region is small, the short channel effect hardly occurs even for a short channel length. Since widening of the depletion layer in the drain region extending to the substrate can be suppressed, this prevents punch-through between the source and drain when the drain voltage rises. If the structure of the first embodiment is used as a source structure, the parasitic resistance of the source region can be kept low, and high current drivability can be maintained.

Further, the source and drain regions 3 and 4 can be formed symmetrically, and sufficient current drivability can be maintained even if the source and drain are formed with the same structure. In the first embodiment, widening of the depletion layer in the drain region extending to the substrate can be suppressed, and an electrode having a low source/drain parasitic resistance can be formed by decreasing the distance from the gate electrode 1 to the conductive layer 15 and making the source/drain semiconductor layer 14 thick.

Vote that the conductive layer (electrode) 15 and the semiconductor layer 14 need not always be in ohmic contact with each other but can be in Schottky contact with each other. This modification has the same structure as that of the device in FIG. 5, the manufacturing process is the same as that in the first embodiment except that the impurity concentration of that portion of the film 14 which is in contact with the conductive layer 15 is kept at $10^{18}$ cm$^{-3}$ or less, and thus a description thereof will be omitted.

Schottky contact can be attained by setting the n- or p-type impurity concentration of that portion of the semiconductor layer 14 which is in contact with the conductive layer 15 to, e.g., $10^{18}$ cm$^{-3}$ or less, and using a metal such as PtSi or ErSi in which a dopant is intentionally not added to the conductive layer 15. In this modification, the impurity concentration of that portion of the semiconductor layer 14 which is in contact with the conductive layer 15 need not be increased to maintain ohmic contact. This facilitates the impurity profile formation process of the layer 14, and eliminates the need for annealing required to maintain good resistance contact. Therefore, metal atoms can be prevented from diffusing from the layer 15 to the semiconductor layer 14, and the layer 15 can be formed nearer the layer 13, which realizes a small structure.

In this modification, if the height of the Schottky barrier is selected to be smaller than the built-in voltage of the p-n junction, the drain depletion layer can be made thinner than in the device of FIG. 5, and the short channel effect can be more reliably suppressed. When the drain voltage is low, the edge of the drain depletion layer remains in the heavily doped layer 13 to form a p-n junction between the substrate and the drain electrode. In conventional source/drain regions formed with a Schottky junction, the edge of the depletion layer reaches the edge of the Schottky electrode. When the drain voltage is low, a leakage current due to thermally-activated electrons flowing through the Schottky barrier poses a problem. In this modification, however, when the drain voltage is low, a depletion layer extending from the substrate 7 to the drain electrode can be separated from a depletion layer extending from the Schottky conductive layer 15 to the drain electrode. Accordingly, the substrate and the drain electrode can be designed to form a p-n junction for a low drain voltage. Unlike the conventional structure, no leakage current due to thermally-activated electrons is generated because of a higher built-in voltage of the p-n junction than the Schottky barrier, and excellent cutoff characteristics can be obtained.

SECOND EMBODIMENT

Figure 10:
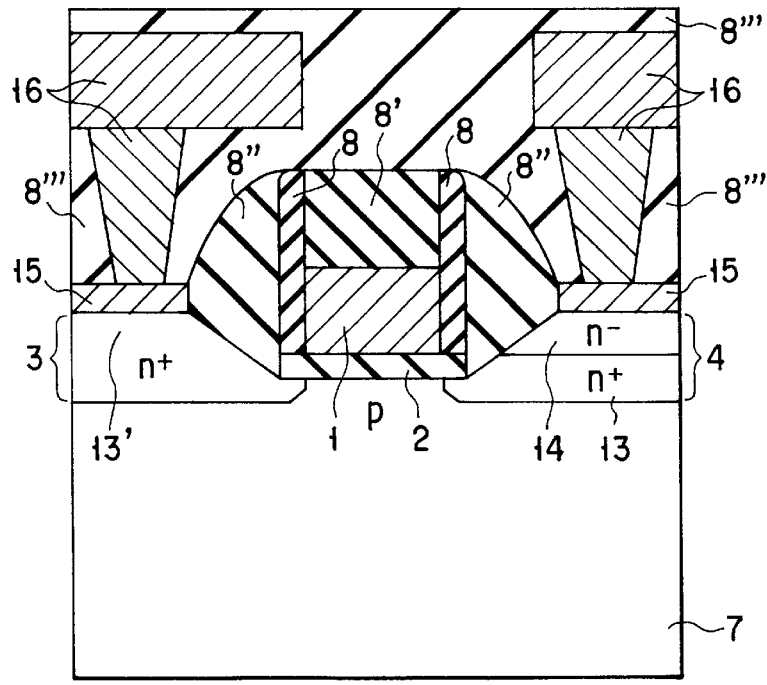
FIG. 10 is a sectional view showing an n-type MISFET according to the second embodiment.

FIG. 10 is a sectional view showing an n-type MISFET according to the second embodiment of the present invention. The same reference numerals as in FIG. 5 denote the same parts, and a detailed description thereof will be omitted.

According to the second embodiment, in the structure of the first embodiment, the source region 3 does not has an impurity distribution symmetrical to that of the drain region 4, and a heavily doped semiconductor layer 13' replaces the lightly doped semiconductor layer 14 in the source region 3.

The method of manufacturing this structure is basically the same as that in the first embodiment. The layer 13' is formed by selectively ion-implanting an n-type impurity such as arsenic, phosphorus, or antimony in a source region at an acceleration voltage of 1 to 300 eV and a dose of $10^{13}$ to $10^{16}$ cm$^{-2}$, following lithography after EV source and drain regions are formed in a step corresponding to the step in FIG. 6B. Alternatively, the layer 13' is formed by solid-phase-diffusing phosphorus or arsenic, following deposition of, e.g., PSG or AsSG, and lithography and etching to selectively leave it on the source region. Then, the PSG or ASSG is removed with, e.g., an aqueous ammonium fluoride solution.

In the second embodiment, in addition to the main characteristics and advantages of the first embodiment, the parasitic resistance of the source region can be decreased by the absence of the lightly doped layer 14, and the current drivability can be enhanced. Even if the source potential is greatly increased, the source edge position hardly varies, thereby causing the current drivability to be stable. However, since the source and drain regions are asymmetric, the device of the second embodiment is effective for a circuit in which the flowing direction of the current between the source and drain regions is the same, such as a static logic circuit like the one in FIG. 1B, but can not be easily applied to a circuit in which the flowing direction of the current changes, such as a pass gate logic circuit.

THIRD EMBODIMENT

Figure 11:
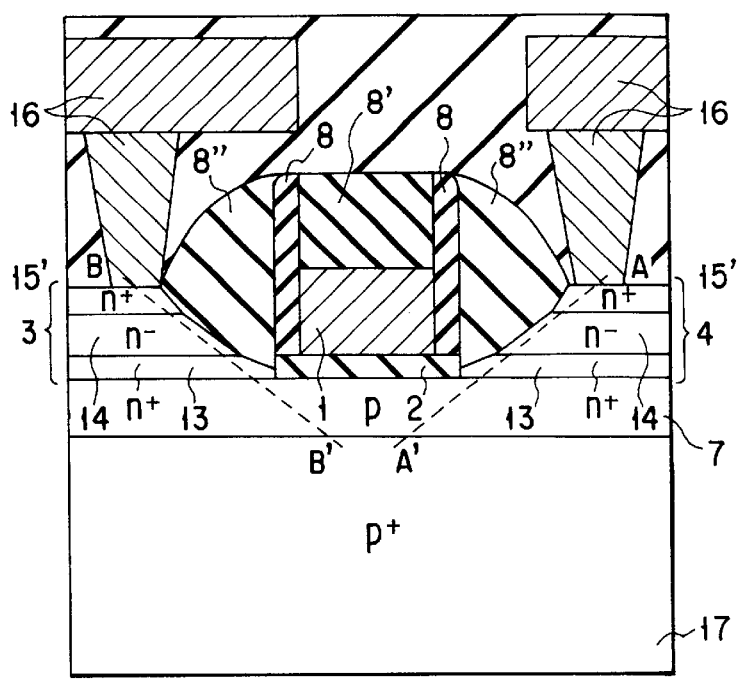
FIG. 11 is a sectional view showing an n-type MISFET according to the third embodiment.

FIG. 11 is a sectional view showing an n-type MISFET according to the third embodiment of the present invention.

The same reference numerals as in FIG. 5 denote the same parts, and a detailed description thereof will be omitted.

The third embodiment is different from the first embodiment in a so-called offset drain structure in which the depth of source/drain regions formed in a semiconductor layer 7 is set very small or 0, and a drain region 4 is formed apart from a gate electrode 1 by an insulating film 8.

This structure can keep the overlapping capacitance between the gate and drain small. When a logic circuit is formed, the load gate capacitance can be decreased to realize high-speed operation. Since the depth of the source/drain regions formed in the semiconductor layer 7 is very small or 0, the short channel effect can be more reliably suppressed.

The third embodiment employs a retrograde channel structure having a semiconductor layer 17 with a high p-type concentration below the semiconductor layer 7. This retrograde well structure is described in, e.g., R. H. Yan et al., IEEE Transactions on Electron Devices 39(7), pp. 1704–1710, 1992. This structure is designed to allow the edge of the depletion layer formed by the gate to reach the semiconductor layer 17 even for a drain voltage near 0V and the source/drain capacitance is small.

Figure 12:
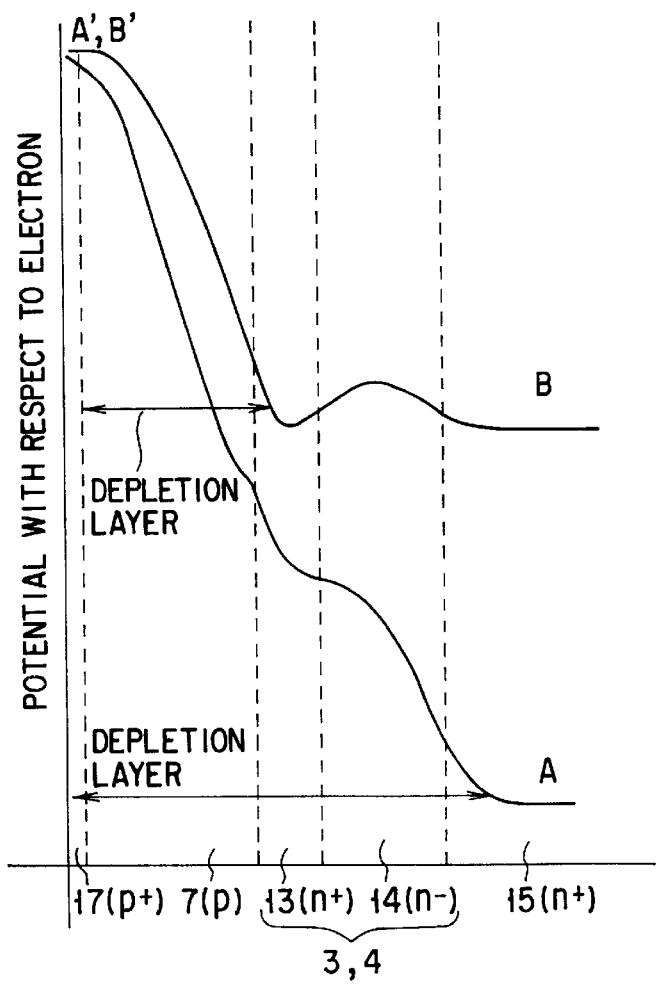
FIG. 12 is a graph showing the potential distributions in sections taken along the lines A–A' and B–B' in the structure of FIG. 11.

FIG. 12 shows the potential distributions in sections taken along the lines A–A' and B–B' in FIG. 11. The p-type impurity concentration of the semiconductor layer 17 is desirably set higher than the n-type impurity concentration of a semiconductor layer 14. In this case, as shown in FIG. 12, the depletion layer extends to the semiconductor layer 14 much more upon application of the drain voltage. This design can prevent the drain depletion layer of the third embodiment from extending to a substrate made up of the layers 7 and 17. The p-type carrier concentration (or the value obtained by subtracting the donor impurity concentration from the acceptor impurity concentration) of the substrate at the substrate-side edge of the depletion layer is higher than the n-type carrier concentration (or the value obtained by subtracting the acceptor impurity concentration from the donor impurity concentration) of the semiconductor layer 14 at the edge of the depletion layer on the semiconductor layer 14 side. This structure is formed by doping a p-type impurity such as In or B at about $10^{17}$ to $10^{20}$ cm$^{-3}$ by ion implantation or epitaxial growth for the layer 17, and doping a p-type impurity at about $10^{15}$ to $10^{17}$ cm$^{-3}$ for the layer 7.

In the third embodiment, in addition to the main characteristics and advantages of the first embodiment, a semiconductor layer 15' which has the same conductivity type as that of the semiconductor layer 13 and is made of, e.g., Si, SiGe, or SiGeC is formed to, e.g., 20 nm to 400 nm on the semiconductor layer 14 in order to decrease the source/drain resistance. Therefore, a material having higher conformity with an underlying semiconductor than silicides can be used, and the device can be more reliably protected from thermal stress and defects induced by the stress.

Figure 13:
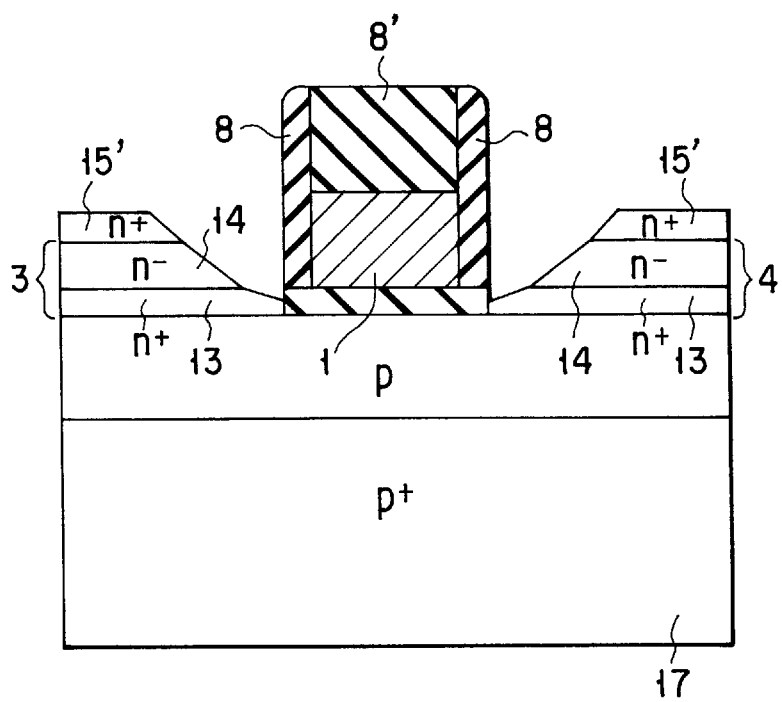
FIG. 13 is a sectional view showing the step in manufacturing the MISFET according to the third embodiment.

The manufacturing method of the third embodiment is basically the same as that of the first embodiment except that, as shown in FIG. 13, the layer 15' is formed subsequent to formation of layers 13 and 14 in FIG. 6B. That is, a semiconductor layer 15' having a thickness of about 0.5 to 100 nm is selectively grown by doping, e.g., As, Sb, or P at $10^{18}$ to $10^{21}$ cm$^{-3}$ at the same time. The subsequent manufacturing method is the same as that of the first embodiment, and a description thereof will be omitted.

In the third embodiment, the resistance of the semiconductor layer 15' is desirably set lower than that of the semiconductor layer 14 in order to decrease the resistance of the drain region 4. The height of the drain region 4, i.e., the height up to the upper edge of the semiconductor layer 15' is desirably set small in order to decrease the parasitic capacitance between the drain region 4 and the gate electrode 1. This can be achieved by setting the n-type impurity concentration of the semiconductor layer 15' higher than the n-type impurity concentration of the semiconductor layer 14.

Figure 14:
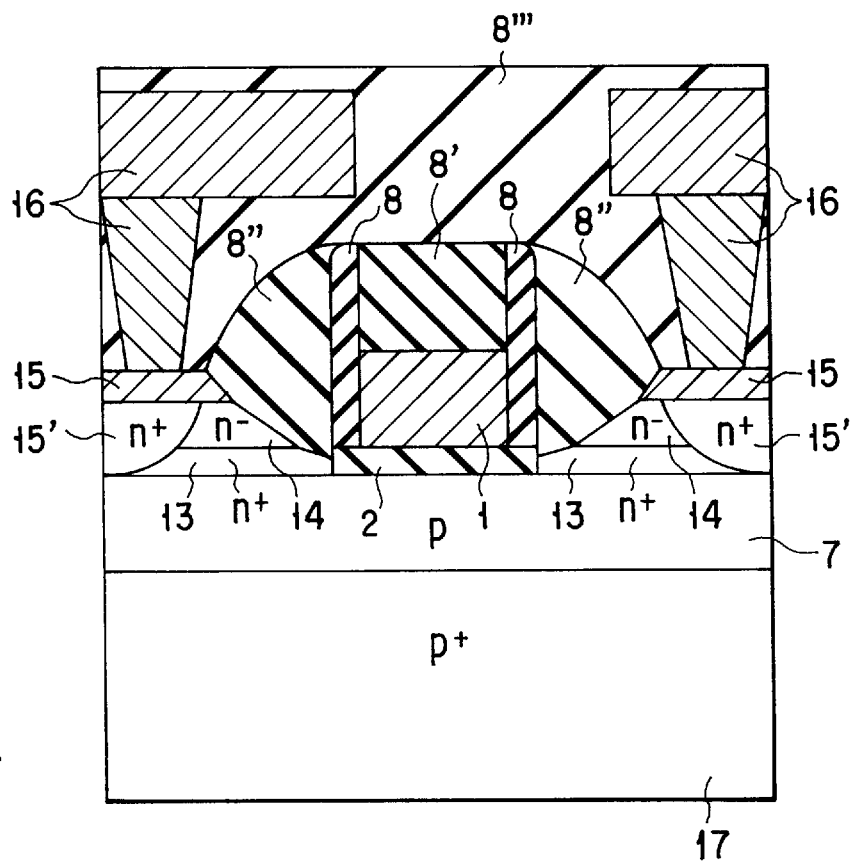
FIG. 14 is a sectional view showing a modification of the third embodiment.

As a modification of the third embodiment, as shown in FIG. 14, e.g., lithography may be performed upon formation of a gate sidewall insulating film 8", and an n-type impurity such as arsenic or phosphorus may be ion-implanted at an acceleration voltage of 1 to 300 eV and a dose of $10^{13}$ to $10^{16}$ cm$^{-2}$ to form a region 15' in which the concentration of the n-type source/drain regions not covered with the gate sidewall insulating film 8" is set higher than that of the layer 14.

This structure can increase the n-type impurity concentration of the semiconductor region where an electrode 16 is in contact with the drain region, and can decrease the resistance between the electrode 16 and the drain region. Since the layer 15' can be formed deeper than the layer 15' in FIG. 11, it can prevent a resistance increase caused by contacting the electrode 16 with the lightly doped n-type layer 14 when the drain region is etched during contact etching of the electrode 16. In this structure, if the resistance of the layers 14 and 15' connected in parallel in the direction of channel length is set lower than the resistance of the layer 13 in the direction of channel length, the source/drain resistance can be decreased, compared to the conventional case in which the source/drain regions are formed from only the layer 13. Consequently, a structure in which the depletion layer does not extend to the substrate side, and the parasitic resistance can be reduced can be realized.

FOURTH EMBODIMENT

Figure 15:
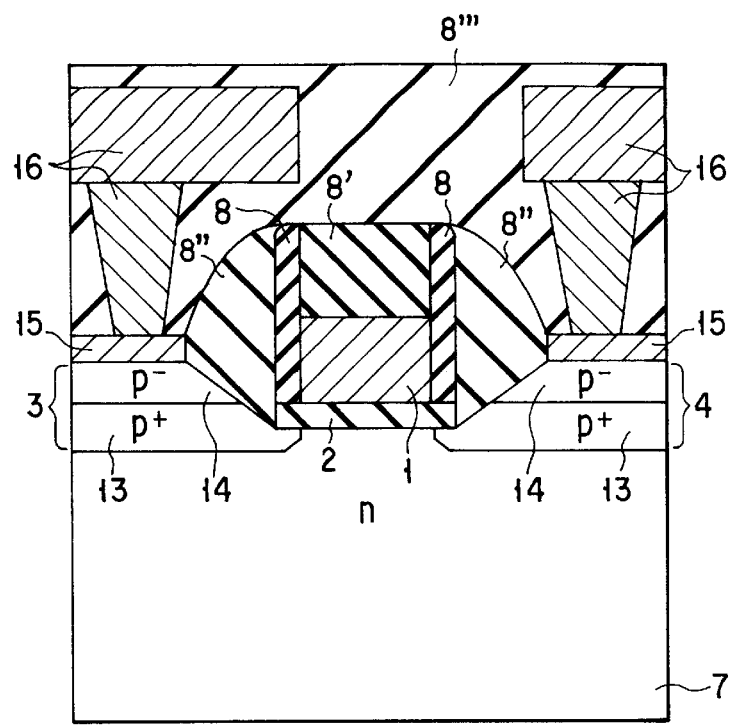
FIG. 15 is a sectional view showing a p-type MISFET according to the fourth embodiment.

FIG. 15 is a sectional view showing a p-type MISFET according to the fourth embodiment of the present invention. Although p- and n-conductivity types are different, the same reference numerals as in FIG. 5 denote the same parts, and a detailed description thereof will be omitted.

In the fourth embodiment, a drain region 4 is formed by stacking doped semiconductor layers 13 and 14 from the side near the channel region. The value obtained by subtracting the donor impurity concentration from the acceptor impurity concentration in the layer 13 is set larger than the value obtained by subtracting the donor impurity concentration from the acceptor impurity concentration in the layer 14. The p-type MISFET in FIG. 15 corresponds to the n-type MISFET in FIG. 5.

A process of manufacturing the semiconductor structure of the fourth embodiment will be described with reference to FIGS. 16A to 16D.

First, a semiconductor substrate on which an n-type layer having, e.g., a phosphorus concentration of $10^{15}$ cm$^{-3}$ is formed is prepared. The concentration of an n-type semiconductor portion 7 may be optimized by ion-implanting and diffusing phosphorus or arsenic in the portion 7 at about $10^{12}$ to $10^{15}$ cm$^{-2}$. The ion implantation energy is set at, e.g., 100 eV to 1,000 eV. The concentration of the well portion is set at $10^{15}$ cm$^{-3}$ to $10^{19}$ cm$^{-3}$. Although not shown, e.g., element isolation such as trench isolation is formed. After that, the concentration of the portion 7 may be optimized by ion-implanting and diffusing phosphorus, arsenic, or antimony in the n-type semiconductor portion 7.

The surface of the semiconductor layer is oxidized or nitrided, e.g., 3 to 100 nm to form a gate insulating film 2.

A polysilicon film serving as a gate electrode 1 is deposited to, e.g., 10 to 200 nm on the entire surface, and decreased in resistance by ion-implanting phosphorus, arsenic, boron, or $BF_2$. Further, e.g., WSi, CoSi, W, or Al may be deposited to, e.g., 10 to 200 nm on the entire surface in order to decrease the resistance of the gate electrode. A silicon oxide film or silicon nitride film serving as an insulating film 8' is deposited to, e.g., 2 to 200 nm on the entire surface and processed into a gate electrode by lithography and reactive ion etching. The insulating film 8' is used to prevent short-circuiting between the gate and the source/drain during formation of a contact, and need not always be formed.

Figure 16A:
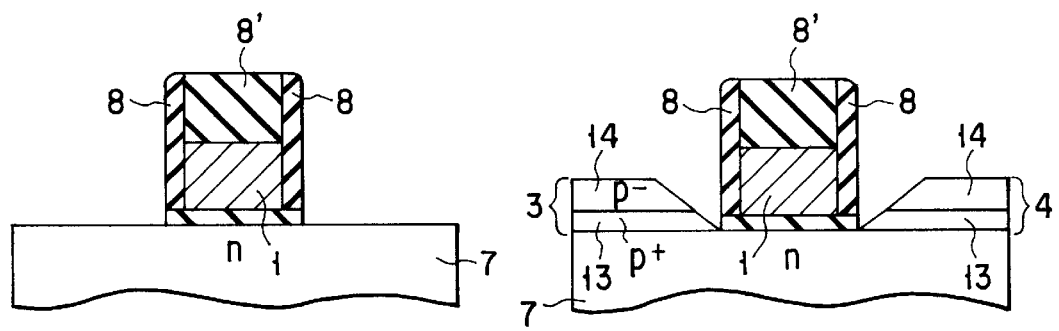
FIGS. 16A to 16D are sectional views, respectively, showing the steps in manufacturing the MISFET according to the fourth embodiment.

Then, e.g., a silicon oxide film or silicon nitride film is deposited to 2 to 200 nm on the entire surface and processed into a sidewall insulating film 8 on the steep sidewall of the gate electrode 1 by anisotropic etching, thereby obtaining a shape shown in FIG. 16A. The sidewall insulating film and the insulating film 8' deposited immediately before lithography surround the gate electrode 1 to easily maintain electrical insulation between the gate electrode 1 and the source/drain regions.

Figure 16B:
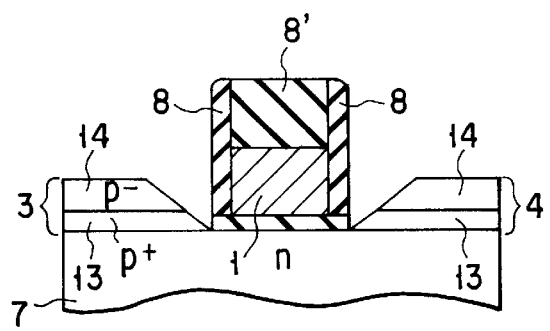

As shown in FIG. 16B, semiconductor layers 13 and 14 having a thickness of, e.g., 5 to 500 nm are formed by selective epitaxial growth using, e.g., Si, an SiGe mixed crystal, or an SiGeC mixed crystal, accompanied by doping. That is, an acceptor-doped semiconductor layer 13 having a thickness of about 0.5 to 10 nm is grown by doping, e.g., B or In at $10^{18}$ to $10^{21}$ $cm^{-3}$. An acceptor-doped semiconductor layer 14 having a thickness of about 4.5 to 490 nm is grown by optimizing the impurity concentration to $10^{16}$ to $10^{18}$ $cm^{-3}$.

In this case, the semiconductor layer 13 may be formed by adsorbing, e.g., $B_2H_6$ onto the surface of the semiconductor layer 7 and selectively epitaxially growing, e.g., Si, an SiGe mixed crystal, or an SiGeC mixed crystal. The semiconductor layer 14 may be formed by out-diffusion from the doped layer 13 instead of performing this impurity doping process.

If the semiconductor substrate has a {100} plane, and the gate is patterned parallel to the <100> direction, a {311} plane can be formed on the gate sidewall where the source and drain regions 3 and 4 are separated more from the gate sidewall 8 toward the upper side, as shown in FIG. 16B. In this case, the capacitance between the gate and source, and the capacitance between the gate and drain can be kept small.

Figure 16C:
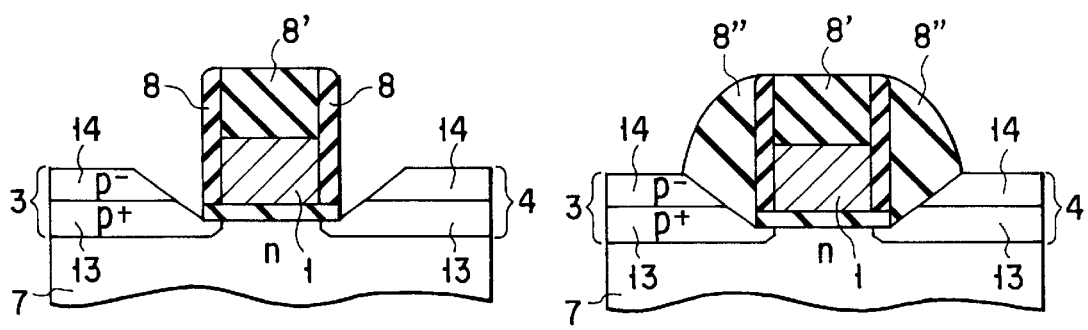
Figure 16D:
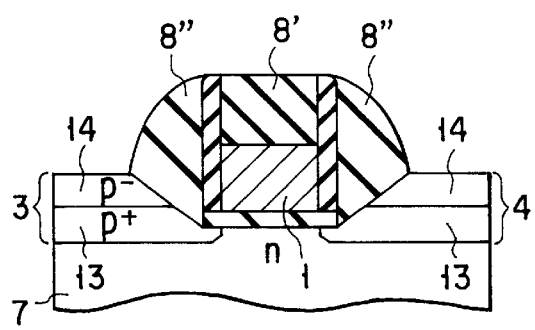

As shown in FIG. 16C, the doped semiconductor layer 13 may be extended by diffusion to the semiconductor layer 7 by heating the resultant structure, e.g., in Ar or $N_2$ atmosphere at 700 to 1,100° C. for 0.01 to 60 sec. The diffusion time is typically the time until the layer 13 is formed below the gate sidewall insulating film 8.

Next, e.g., a silicon oxide film or silicon nitride film is deposited to 2 to 200 nm on the entire surface. A silicon oxide film or silicon nitride film is deposited to 2 to 200 nm on the entire steep sidewall of the sidewall insulating film 8 and processed into a sidewall insulating film 8" by anisotropic etching, thereby obtaining a shape in FIG. 16D. This insulating film is used to prevent point defects and impurity diffusion produced in the subsequent step of forming the conductive layer 15 from deteriorating the crystal quality below the gate electrode 1.

Thereafter, although not shown, lithography may be performed, and a p-type impurity such as boron or $BF_2$ may be ion-implanted at an acceleration voltage of 1 to 30 eV and a dose of $10^{13}$ to $10^{16}$ $cm^{-2}$ to increase the concentration of the semiconductor layer 14 not covered with the gate sidewall insulating film 8". Silicide or metal layers are selectively formed on the source and drain regions 3 and 4 to obtain conductive layers 15. The conductive layers 15 are formed such that, e.g., Co or Ti is deposited to 0.01 to 0.3 $\mu$m on the entire surface and annealed at 600° C. or more to selectively form CoSi or TiSi layers on the source and drain regions 3 and 4, and the remaining metal is selectively etched away with, e.g., a solution mixture of sulfuric acid and hydrogen peroxide.

After an interlevel insulating film 8''' made of, e.g., silicon oxide, PSG, or BPSG is deposited to, e.g., 20 to 1,000 nm, wiring contacts are formed by lithography and reactive ion etching, and a silicide such as TiSi or WSi or a metal such as Al or W is deposited to form upper electrode interconnection layers 16, thereby completing a semiconductor structure.

In the fourth embodiment, the layer 13 is desirably formed using, as an epitaxial growth dopant, a Group III element such as B rather than a Group V element such as As or P because Group III elements have higher epitaxial growth rate, and the concentration of an activated impurity is as high as about $10^{20}$ $cm^{-3}$. With the fourth embodiment, the main advantages of the first embodiment can be also achieved.

FIFTH EMBODIMENT

Figure 17:
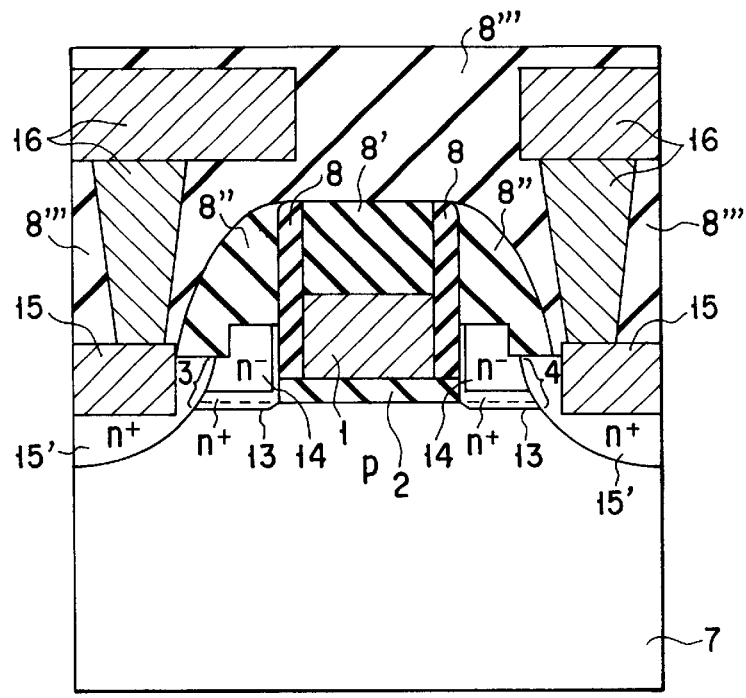
FIG. 17 is a sectional view showing an n-type MISFET according to the fifth embodiment.

FIG. 17 is a sectional view showing an n-type MISFET according to the fifth embodiment of the present invention. The same reference numerals as in FIG. 5 denote the same parts, and a detailed description thereof will be omitted.

The fifth embodiment is different from the first embodiment in the formation method and structure of an EV source/drain structure. In FIG. 17, a drain region 4 near a gate electrode 1 is built by stacking doped semiconductor layers 13 and 14 from the side near the channel region. The value obtained by subtracting the acceptor impurity concentration from the donor impurity concentration in the layer 13 is set larger than the value obtained by subtracting the acceptor impurity concentration from the donor impurity concentration in the layer 14. The fifth embodiment is characterized by the formation method of layers 13 and 14.

A process of manufacturing the semiconductor structure of the fifth embodiment will be described with reference to FIGS. 18A to 19C.

Figures 18A, 18B:
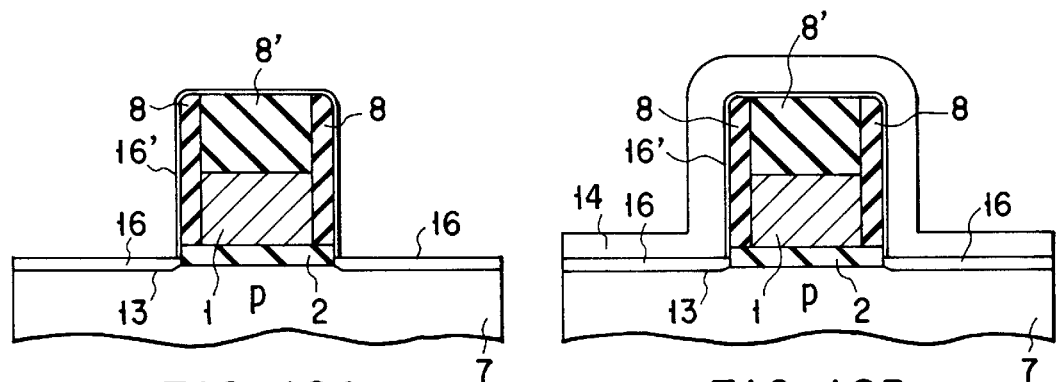
FIGS. 18A to 18C are sectional views, respectively, showing the steps in manufacturing the MISFET according to the fifth embodiment.

The process for formation of the gate electrode 1 in FIG. 6A is the same as that in the first embodiment, and a description thereof will be omitted. As shown in FIG. 18A, e.g., As, Sb, or P is added to the surface as n-type heavily doped layers 16 for forming, e.g., n-type source and drain regions. As this method, e.g., $AsH_3$ or $PH_3$ gas is flowed, or Sb molecular beam is radiated with a surface coverage of between $10^{-4}$ and $10^0$, while a semiconductor layer 7 is and heated to 500 to 900° C., to adsorb and diffuse atom layers in the surface of the semiconductor layer 7.

When a silicon layer is used as the semiconductor layer 7, and silicon oxide or nitride films are used as insulating films 8 and 8' covering the side and upper surfaces of the gate, the diffusion constant of B, As, or P in the semiconductor layer 7 is more than 10 times larger than the diffusion constant in the insulating films 8 and 8', and B, As, or P can be selectively diffused in the silicon surface of the semiconductor layer 7. In equilibrium, the concentration of As or P in the silicon oxide film is lower than the concentration of silicon. Accordingly, silicon oxide films can be desirably used as the sidewall insulating films 8 and 8' because the dopant can be selectively introduced at high density at the silicon surface.

Note that reference numeral 16' denotes an n-type impurity adsorbed layer formed on the insulating films 8 and 8' covering the side and upper surfaces of the gate. The presence of the layer 16' is negligible compared to the layer 16 so long as a satisfactory adsorption selectivity can ensured between the insulating films 8 and 8' and the semiconductor layer 7. Simultaneously as an n-type impurity is adsorbed, Si, an SiGe mixed crystal, or an SiGeC mixed crystal may be deposited on the entire surface by flowing, e.g., $SiH_4$, $Si_2H_6$, or $GeH_4$ gas.

As shown in FIG. 18B, e.g., $SiH_4$, $Si_2H_6$, or $GeH_4$, gas is flowed to deposit a semiconductor film made of, e.g., Si, an SiGe mixed crystal, or an SiGeC mixed crystal on the entire surface, thereby forming a layer serving as a semiconductor layer 14. The donor dopant for the layer 14 is optimized to have an impurity concentration of, e.g., $10^{16}$ to $10^{18}$ cm$^{-3}$ to grow a 5- to 500-nm thick layer 14. The layer 14 may be formed by impurity segregation from the doped layer 16 instead of performing this intentional impurity doping process.

Figure 18C:
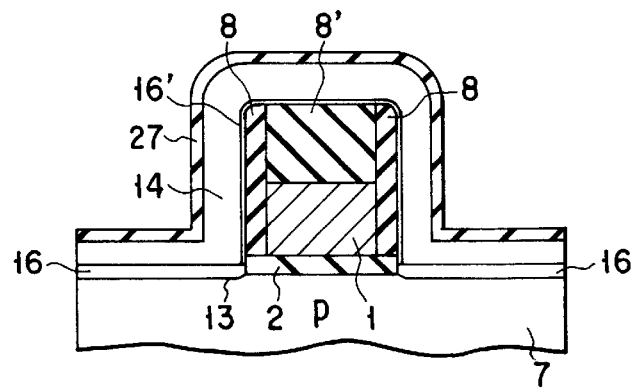

As shown in FIG. 18C, an insulating film 27 serving as an etching mask material is deposited to 2 to 200 nm on the entire surface. As the material of the insulating film 27, a silicon oxide film or silicon nitride film is used, and a material which can be etched more easily than the insulating films 8 and 8' is desirably used. For example, when the insulating films 8 and 8' are silicon nitride films, the insulating film 27 is desirably a silicon oxide film; when the insulating films 8 and 8' are silicon oxide films, the insulating film 27 is desirably a silicon nitride film.

The etching mask material 27 and the semiconductor film 14 on the insulating film 8' on the gate electrode are removed by, e.g., chemical mechanical polishing (CMP). By CMP, the etching mask material 27 with a convex shape can be selectively removed. At this time, if the etching rate of the semiconductor film 14 is higher than that of the insulating films 8' and 8, a shape shown in FIG. 19A can be obtained.

Figure 19A:
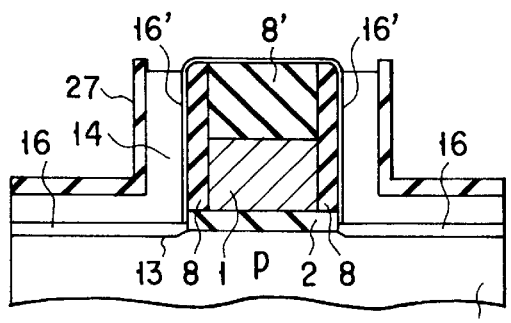
FIGS. 19A to 19C are sectional views, respectively, showing the steps subsequent to FIG. 18C in manufacturing the MISFET according to the fifth embodiment.
Figure 19B:
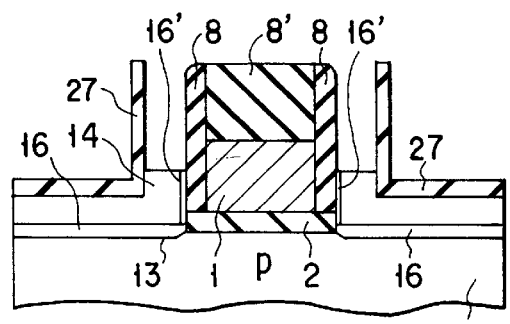
Figure 19C:
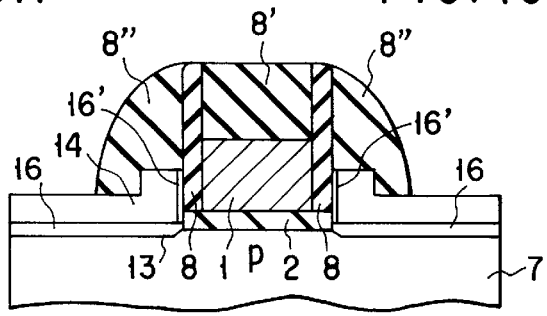

Next, e.g., the semiconductor layer 14 is etched along the gate electrode 8 so as to attain a height of 5 to 200 nm from the semiconductor layer 7, thereby obtaining a shape in FIG. 19B.

The film 27 is etched with an ammonium fluoride solution when the film 27 is a silicon oxide film, or with phosphoric acid heated to 100° C. to 200° C. when the film 27 is a silicon nitride film. For example, a silicon oxide film or silicon nitride film is deposited to 2 to 200 nm on the entire surface and processed into a gate sidewall insulating film 8' on the steep sidewall of the sidewall insulating film 8 by anisotropic etching, thereby obtaining a shape in FIG. 19C. This insulating film is used to prevent point defects and impurity diffusion produced in the subsequent step of forming the conductive layer 15 from deteriorating the crystal quality below the gate electrode 1.

After that, although not shown, lithography is performed, and an n-type impurity such as arsenic or phosphorus is ion-implanted at an acceleration voltage of 1 to 300 eV and $10^{13}$ to $10^{16}$ cm$^{-2}$ to form n-type source and drain layers 15'. Silicide or metal layers are selectively formed on the source and drain regions 3 and 4 to obtain conductive layers 15. The conductive layers 15 are formed such that, e.g., Co or Ti is deposited to 0.01 to 0.3 μm on the entire surface and annealed at 600° C. or more to selectively form CoSi or TiSi layers on the source and drain regions 3 and 4, and the remaining metal is selectively etched away with, e.g., a solution mixture of sulfuric acid and hydrogen peroxide.

After an interlevel insulating film is deposited, wiring contacts are formed by lithography and reactive ion etching, and a silicide such as WSi or a metal such as Al or W is deposited to form upper electrode interconnection layers 16, thereby completing a semiconductor structure.

In addition to the main characteristics and advantages of the first embodiment, the fifth embodiment is different from the first embodiment in that the structure is formed using non-selective semiconductor deposition and etching instead of selective epitaxial growth. Using non-selective semiconductor deposition can solve problems such as spread of growth defects or underlayer defects by any residual insulating underlayer such as a silicon oxide film or silicon nitride film, a decrease in selectivity arising from metal impurities, and a decrease in deposition rate generated when selective growth is performed while an n-type impurity such as As or P is heavily doped. In selective epitaxial growth, the shape of a growth region and the deposition rate depend on the crystal orientation of the underlayer. However, the fifth embodiment is free from this problem because of non-selective semiconductor deposition.

Figure 20A:
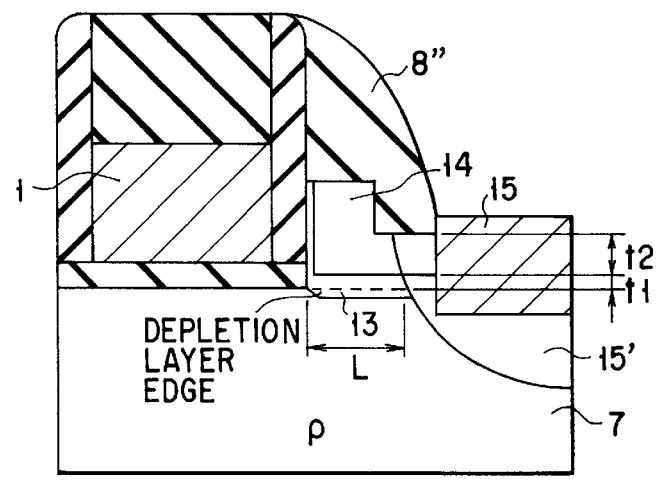
FIGS. 20A and 20B are a sectional view showing the drain of the MISFET according to the fifth embodiment, and a graph showing the film thickness dependence of the source/drain resistance in this device, respectively.

The resistance R per unit width W of the source/drain regions formed below the sidewall insulating film 8" will be explained with reference to FIG. 20A. Letting L be the thickness of the sidewall insulating film, t1 be the thickness of a non-depleted portion of the layer 13 on the assumption that part of the layer 13 is depleted, t2 be the thickness of the layer 14, and ρ1 and ρ2 be the average resistivities of the layers 13 and 14, R can be approximated at the parallel resistances ρ1L/(Wt1) and ρ2L/(Wt2) of the respective layers:

$$R \approx (L/W) \cdot (\rho 1/t1) \cdot (\rho 2/t2) / \{(\rho 1/t1) + (\rho 2/t2)\} \tag{7}$$

Figure 20B:
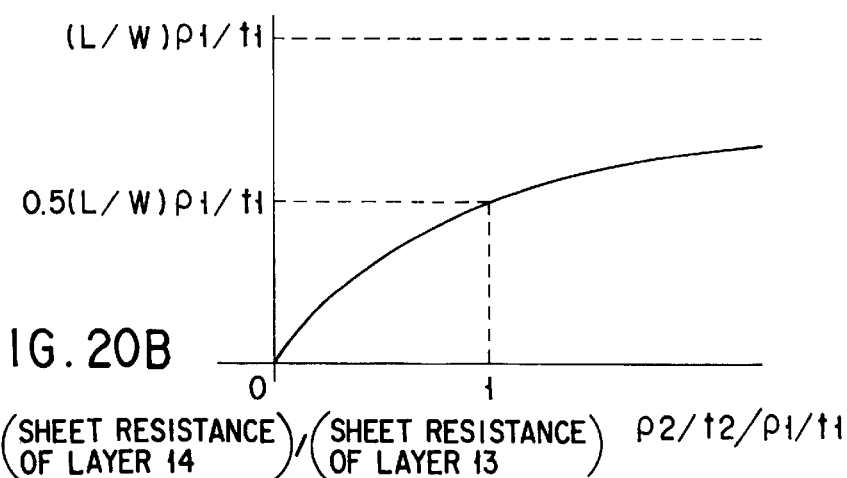

FIG. 20B shows R in equation (7) with its abscissa representing (ρ2/t2)/(ρ1/t1). As is apparent from FIG. 20B, if (ρ2/t2)<(ρ1/t1), R can be decreased to ½ or less, compared to the case in which the source/drain region is formed from only the layer 13. By designing (ρ2/t2) so as to satisfy (ρ2/t2)<(ρ1/t1), variations in net source/drain resistance and variations in current drivability can be suppressed even if the resistivity and thickness of the layer 13 vary.

SIXTH EMBODIMENT

Figure 21:
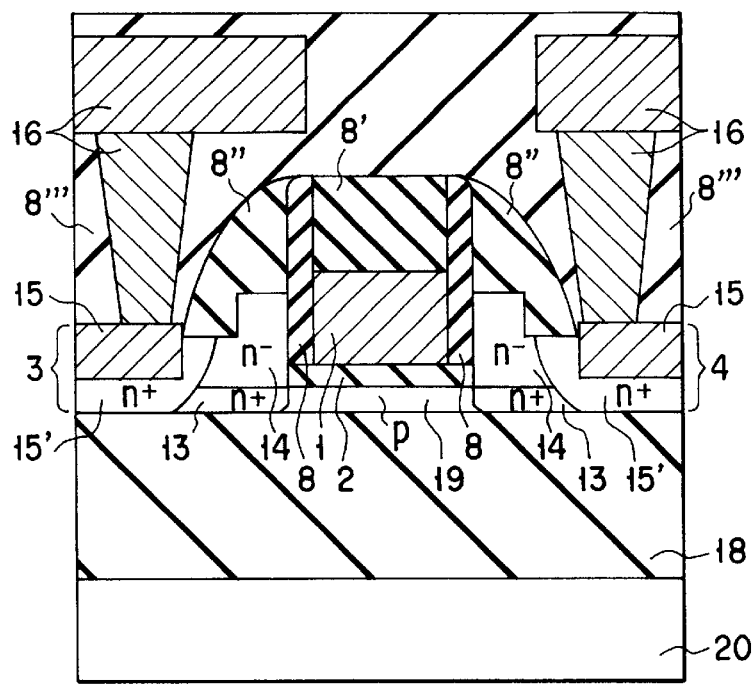
FIG. 21 is a sectional view showing an n-type MISFET according to the sixth embodiment.

FIG. 21 is a sectional view showing an n-type MISFET according to the sixth embodiment of the present invention. The same reference numerals as in FIG. 17 denote the same parts, and a detailed description thereof will be omitted.

The sixth embodiment is an improvement of the fifth embodiment and is different from the fifth embodiment in the formation method and structure of a semiconductor layer 7 and source drain regions 3 and 4.

In FIG. 21, a layer corresponding to the semiconductor layer 7 for forming a channel region in the fifth embodiment is constituted by a single-crystal semiconductor layer 19 with a thickness of 3 to 200 nm in which a p-type impurity is doped at a concentration of $10^{19}$ cm$^{-3}$ or less. An insulating film 18 made of a silicon oxide film or silicon nitride film with a thickness of 1 nm to 500 nm is formed below the semiconductor layer 19. A substrate 20 is formed below the insulating film 18. When the layer 19 is made of silicon, these layers 18 to 20 form a so-called silicon on insulator (SOI) structure.

This structure can prevent the depth of the semiconductor layer 13 from increasing.

A process of manufacturing the semiconductor structure of the sixth embodiment will be explained with reference to FIGS. 22A to 23C.

First, a composite substrate constructed by forming an insulating film 18 made of a silicon oxide film or silicon nitride film to a thickness of 1 to 500 nm, and a single-crystal semiconductor layer 19 to a thickness of 3 to 200 nm on, e.g., a silicon semiconductor substrate 20 is prepared. This composite substrate can be formed by bonding two substrates via an insulating film and making one of the substrates thin by etching, or SIMOX which implants oxygen ions in a single-crystal silicon substrate and forms a silicon oxide film to a predetermined depth.

Figure 22A:
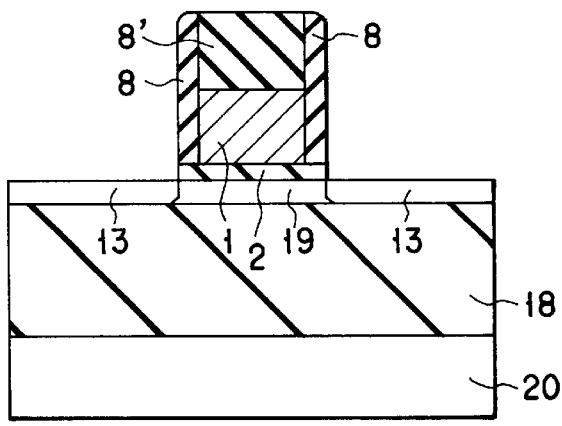
FIGS. 22A and 22B are sectional views, respectively, showing the steps in manufacturing the MISFET according to the sixth embodiment.

The process from formation of a gate electrode 1 to formation of a gate sidewall insulating film 8 is the same as that in the first embodiment, and a description thereof will be omitted. As shown in FIG. 22A, e.g., As, Sb, or P is added to the surface of the single-crystal silicon layer 19 to form n-type heavily doped layers 13 for forming, e.g., n-type source and drain regions. As this method, e.g., As, Sb, or P is ion-implanted at an ion implantation energy of 1 to 100 eV and a dose of $10^{12}$ to $10^{16}$ cm$^{-2}$. Since the depth of the source/drain region is determined by the thickness of the layer 19, it does not increase with an increase in dose, unlike formation of a semiconductor portion in the first embodiment.

Next, e.g., SiH$_4$, Si$_2$H$_6$, or GeH$_4$ gas is flowed to deposit a semiconductor film made of, e.g., Si, an SiGe mixed crystal, or an SiGeC mixed crystal on the entire surface, thereby forming a layer serving as a semiconductor layer 14. The donor dopant for the layer 14 is optimized to have an impurity concentration of, e.g., $10^{16}$ to $10^{18}$ cm$^{-3}$ to grow a 5- to 500-nm thick layer 14. The layer 14 may be formed by impurity segregation from the doped layer 13 instead of performing this intentional impurity doping process.

Figure 22B:
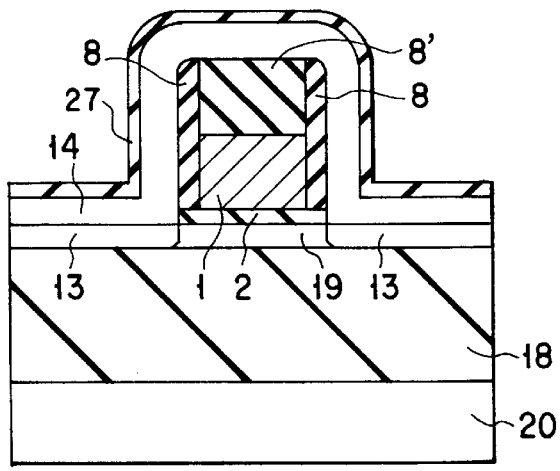

As shown in FIG. 22B, an insulating film 27 serving as an etching mask material is deposited to 2 to 200 nm on the entire surface. As the material of the insulating film 27, a silicon oxide film or silicon nitride film is used, and a material which can be etched more easily than the insulating films 8 and 8' is desirably used. For example, when the insulating films 8 and 8' are silicon nitride films, the insulating film 27 is desirably a silicon oxide film; when the insulating films 8 and 8' are silicon oxide films, the insulating film 27 is desirably a silicon nitride film.

The etching mask material 27 on the insulating film 8' on the gate electrode is removed by, e.g., CMP to expose the semiconductor layer 14. By CMP, the etching mask material 27 with a convex shape can be selectively removed to obtain a shape shown in FIG. 23A.

Figure 23A:
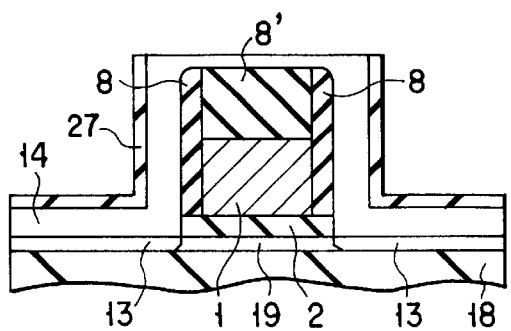
FIGS. 23A to 23C are sectional views, respectively, showing the steps subsequent to FIG. 22B in manufacturing the MISFET according to the sixth embodiment.
Figure 23B:
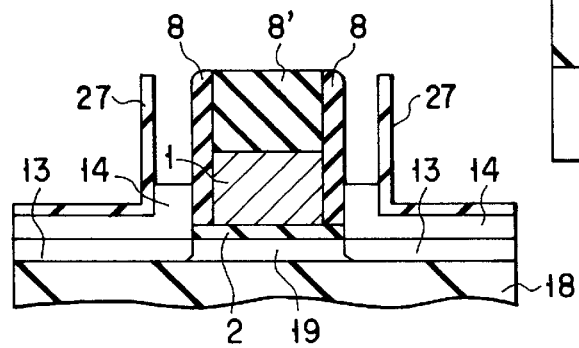
Figure 23C:
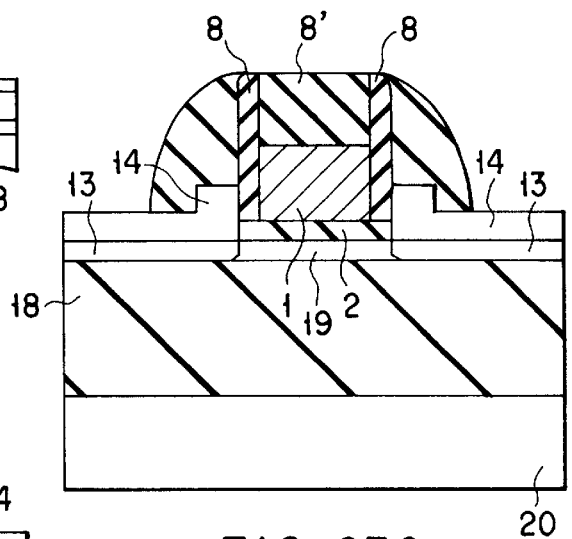

Then, e.g., the semiconductor layer 14 is etched along the gate electrode 8 so as to attain a height of 5 to 200 nm from the semiconductor layer 7, thereby obtaining a shape in FIG. 23B.

The film 27 is etched with an ammonium fluoride solution when the film 27 is a silicon oxide film, or with phosphoric acid heated to 100° C. to 200° C. when the film 27 is a silicon nitride film. For example, a silicon oxide film or silicon nitride film is deposited to 2 to 200 nm on the entire surface and processed into a gate sidewall insulating film 8'' on the steep sidewall of the sidewall insulating film 8 by anisotropic etching, thereby obtaining a shape in FIG. 23C. This insulating film is used to prevent point defects and impurity diffusion produced in the subsequent step of forming the conductive layer 15 from deteriorating the crystal quality below the gate electrode 1.

Thereafter, although not shown, lithography is performed, and an n-type impurity such as arsenic or phosphorus is ion-implanted at an acceleration voltage of 1 to 300 eV and a dose of $10^{13}$ to $10^{16}$ cm$^{-2}$ to form n-type source and drain layers 15' and decrease the contact resistance. Silicide or metal layers are selectively formed on the source and drain regions 3 and 4 to obtain conductive layers 15. The conductive layers 15 are formed such that, e.g., Co or Ti is deposited to 0.01 to 0.3 μm on the entire surface and annealed at 600° C. or more to selectively form CoSi or TiSi layers on the source and drain regions 3 and 4, and the remaining metal is selectively etched away.

After an interlevel insulating film is deposited, wiring contacts are formed by lithography and reactive ion etching, and a silicide such as WSi or a metal such as Al or W is deposited to form upper electrode interconnection layers, thereby completing a semiconductor structure.

The sixth embodiment is different from the fifth embodiment in the use of so-called SOI substrate structure. With the SOI substrate, the depth of the layer 13 forming source/drain regions is limited by the thickness of the single-crystal portion 19 and does not increase. For this reason, the shallow layer 13 can be formed by an easy method such as conventional ion implantation.

SEVENTH EMBODIMENT

Figure 24:
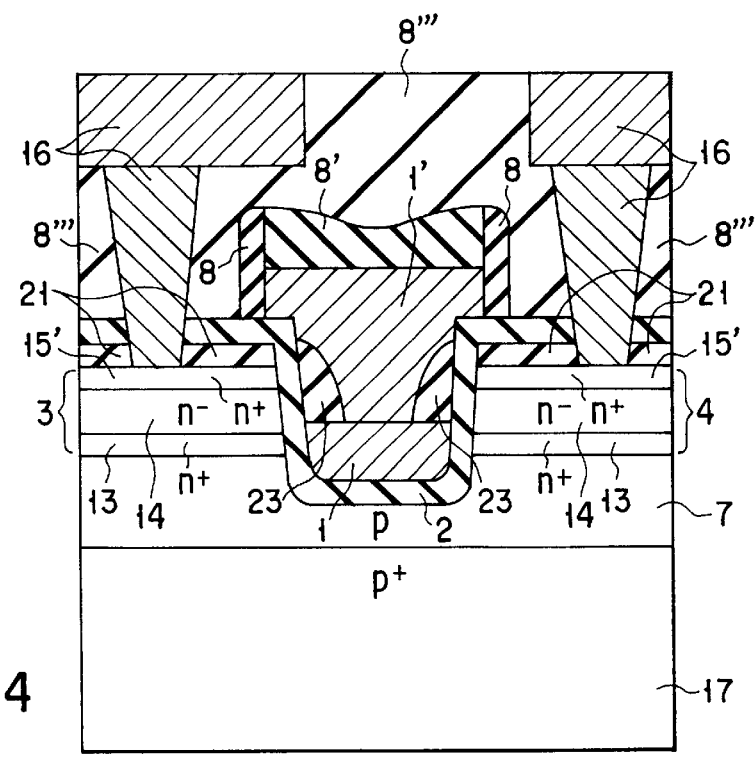
FIG. 24 is a sectional view showing an n-type MISFET according to the seventh embodiment.

FIG. 24 is a sectional view showing an n-type MISFET according to the seventh embodiment of the present invention. The same reference numerals as in FIG. 5 denote the same parts, and a detailed description thereof will be omitted.

The seventh embodiment is different from the fifth embodiment in the formation method and structure of an EV source/drain.

The seventh embodiment employs a recessed gate structure in which a gate electrode 1 is buried in a semiconductor layer 7. In this structure, since source and drain regions 3 and 4 can be formed in advance, a gate insulating film 2 is free from any influence of thermal budget necessary for activating the impurities of the source and drain regions 3 and 4, and thermal budget for the gate insulating film 2 can be small. Therefore, as the gate insulating film 2, a tantalum oxide film, a ferroelectric film such as a strontium titanate film, a barium titanate film, or a lead zirconate titanate film, a single paraelectric film, or a composite film of them is available. If the depth of a trench for forming a gate is adjusted, the source and drain regions 3 and 4 can be formed above the interface between the gate insulating film 2 and a semiconductor layer 7.

In FIG. 24, the drain region 4 near the gate electrode 1 is formed by stacking doped semiconductor layers 13 and 14 from the side near the channel region. The value obtained by subtracting the acceptor impurity concentration from the donor impurity concentration in the layer 13 is set larger than the value obtained by subtracting the acceptor impurity concentration from the donor impurity concentration in the layer 14. A semiconductor layer 15' may be formed on the layer 14 to decrease the source/drain resistance. The value obtained by subtracting the acceptor impurity concentration from the donor impurity concentration in the layer 15' is set larger than the value obtained by subtracting the acceptor impurity concentration from the donor impurity concentration in the layer 14.

A process of manufacturing the semiconductor structure of the seventh embodiment will be described with reference to FIGS. 25A to 26B.

In FIG. 24, a retrograde channel structure having a p-type heavily doped semiconductor portion 17 is formed below the semiconductor layer 7. The p-type impurity concentration of the semiconductor layer 17 is desirably set higher than the n-type impurity concentration of the semiconductor layer 14. In this case, the depletion layer extends to the semiconductor layer 14 much more upon application of the drain voltage. This design can prevent the drain depletion layer from extending to the substrate side. The p-type carrier concentration (or the value obtained by subtracting the donor impurity concentration from the acceptor impurity concentration) of the substrate at the substrate-side edge of the depletion layer is higher than the n-type carrier concentration (or the value obtained by subtracting the acceptor impurity concentration from the donor impurity concentration) of the semiconductor layer 14 at the edge of the depletion layer on the semiconductor layer 14 side. This structure is formed by doping a p-type impurity such as In or B at around $10^{17}$ to $10^{19}$ cm$^{-3}$ by ion implantation or epitaxial growth for the layer 17, and doping a p-type impurity at around $10^{15}$ to $10^{17}$ cm$^{-3}$ for the layer 7.

First, e.g., As, P, or Sb is ion-implanted in the semiconductor layer 7 at an acceleration energy of 10 to 100 eV and a dose of $10^{12}$ to $10^{16}$ cm$^{-2}$ to form an n$^+$-type semiconductor layer 13. As, P, or Sb is ion-implanted at a dose of $10^{11}$ to $10^{15}$ cm$^{-2}$ with such energy as to attain a smaller implantation depth than the layer 13, thereby forming an n$^-$-type semiconductor layer 14. As, P, or Sb is ion-implanted at a dose of $10^{13}$ to $10^{16}$ cm$^{-2}$ with such energy as to attain a smaller implantation depth than the layer 14, thereby forming an n$^+$-type semiconductor layer 15'. An oxide film 21 is formed on the semiconductor layer 15', thereby obtaining a section in FIG. 25A.

The layer 13 has a thickness of about 0.5 to 10 nm, the layer 14 has a thickness of about 4.5 to 490 nm, and the layer 15' has a thickness of about 10 to 500 nm. To enhance the selectivity to subsequent etching, the oxide film 21 may be removed with, e.g., an ammonium fluoride solution, and, e.g., another silicon oxide film may be formed again to 5 to 100 nm.

Figure 25A:
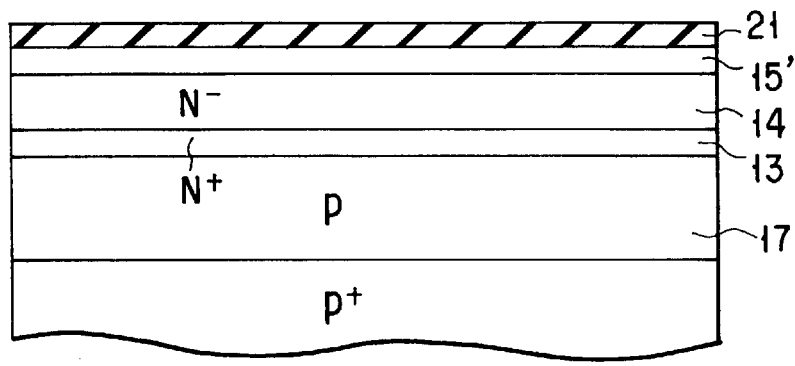
FIGS. 25A to 25C are sectional views, respectively, showing the steps in manufacturing the MISFET according to the seventh embodiment.
Figure 25B:
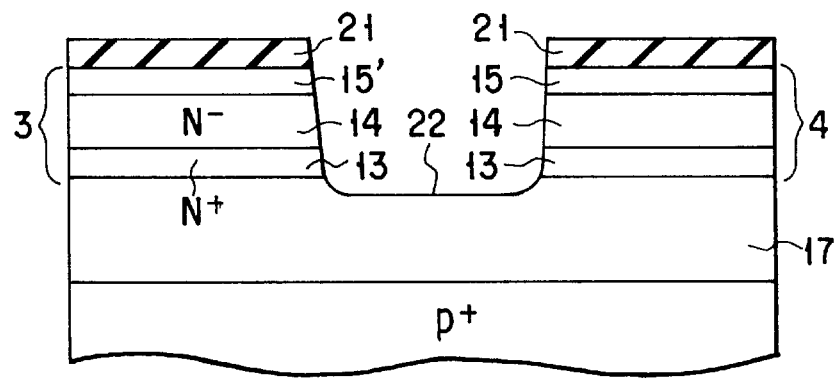
Figure 25C:
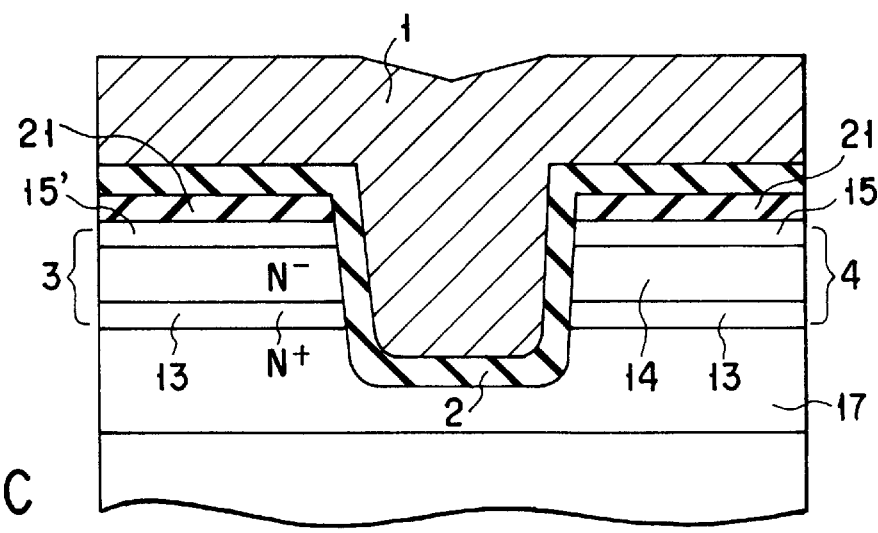
Figure 26A:
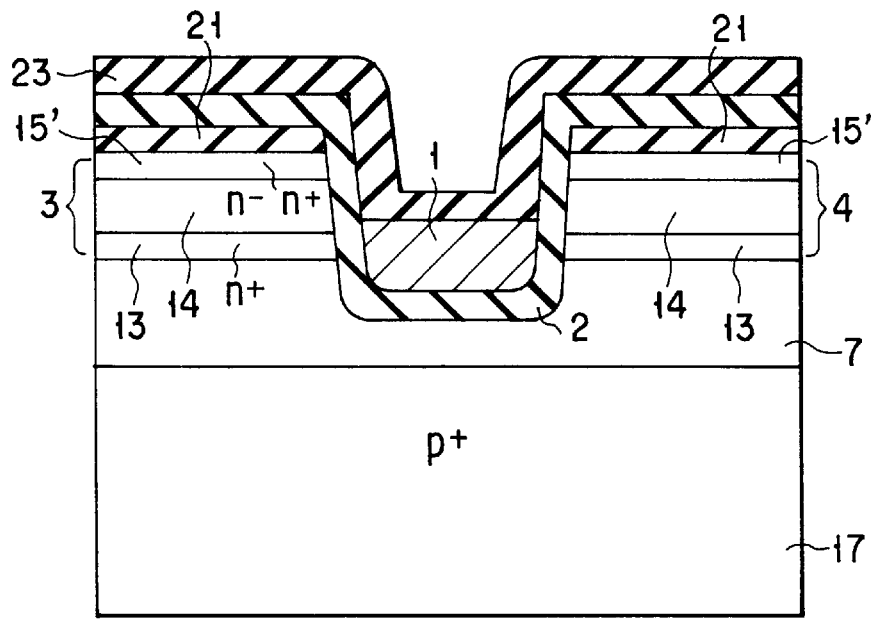
FIGS. 26A and 26B are sectional views, respectively, showing the steps subsequent to FIG. 25C in manufacturing the MISFET according to the seventh embodiment.
Figure 26B:
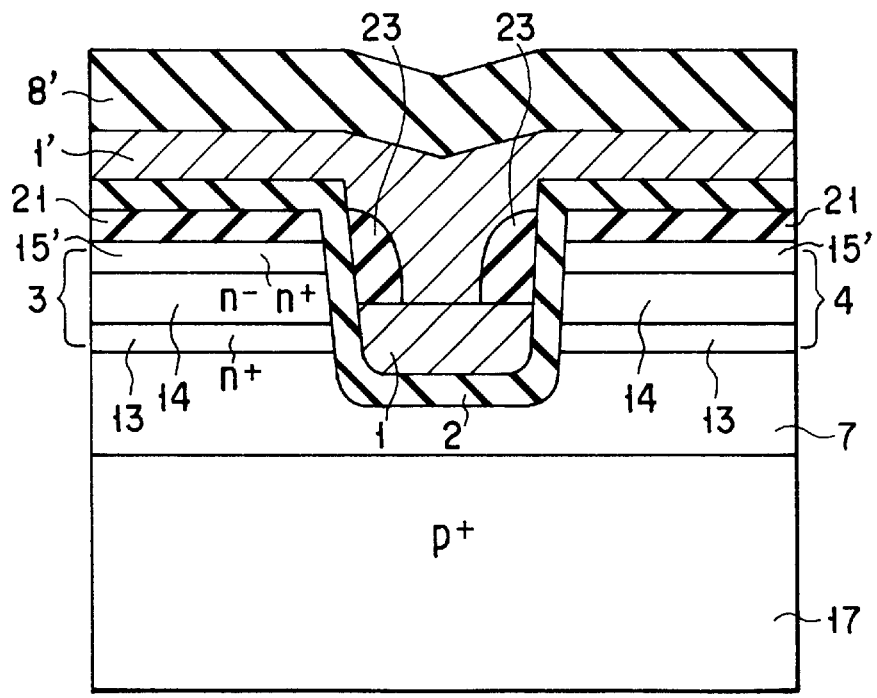

Then, a trench 22 is formed at the prospective gate portion by lithography and etching to isolate the source and drain regions. The trench is formed with a depth enough to extend through at least the layer 13 and reach that portion in the layer 7 which corresponds to 1 μm or less from the layer 13. To make the film thickness uniform in the subsequent steps of depositing a gate insulating film and a gate electrode, and not to generate any void, the trench 22 is preferably tapered wider upward at, e.g., 60° to 89.5°, as shown in FIG. 25B. To suppress concentration of the electric field by the edge effect, the angle defined by the bottom and side surfaces of the trench 22 is desirably rounded with a radius of curvature: (the thickness of the gate insulating film)×(the dielectric constant of the semiconductor layer 7)/(the dielectric constant of the gate insulating film 2) or more, as shown in FIG. 25B.

A silicon oxide film, a silicon nitride film, a tantalum oxide film, a ferroelectric film such as a strontium titanate film, a barium titanate film, or a lead zirconate titanate film, a single paraelectric film, or a composite film of them is deposited to 3 to 100 nm on the surface of the semiconductor layer 7, thereby forming a gate insulating film 2. For the gate electrode 1, polysilicon is deposited to, e.g., 10 to 200 nm on the entire surface, and phosphorus, arsenic, or boron is ion-implanted in the polysilicon layer to decrease the resistance. In place of polysilicon, Ru metal, Ir metal, Pt metal, or conductive metal oxide, such as RuO$_2$, may be deposited. As a result, a shape in FIG. 25C can be obtained.

The gate electrode material is etched and left in only the trench 22. The gate electrode material is etched to make its upper level higher than the layer 13 and lower than the layer 15'. An insulating film 23 made of, e.g., a silicon oxide film or silicon nitride film is deposited on the entire surface to obtain a shape in FIG. 26A. The insulating film 23 is used to weaken the electric field between the layer 15' and the gate electrode 1 to which the strongest voltage is applied, to prevent a leakage current and dielectric breakdown between the gate and the source/drain regions, and to prevent a gate-induced drain leakage. The insulating film 23 has a thickness of, e.g., 3 to 20 nm, which is smaller than half the gate electrode length.

The insulating film 23 is etched by, e.g., anisotropic etching and left only on the sidewall of the trench 22. In this case, the film 23 faces the layer 15' via the insulating film 2. After a gate electrode material made of, e.g., Al, W, WSi, or CoSi is deposited to, e.g., 10 to 500 nm on the entire surface, an insulating film 8' made of, e.g., a silicon oxide film or silicon nitride film, which serves as a protective material for the upper gate portion, is deposited on the entire surface to obtain a shape in FIG. 26B.

The resultant structure is processed into a gate electrode 1' by lithography and reactive ion etching. The insulating film 8' is used to prevent short-circuiting between the gate and the source/drain during formation of a contact, and need not always be formed. Further, e.g., a silicon oxide film or silicon nitride film is deposited to 2 to 200 nm on the entire surface and processed into a gate sidewall insulating film 8 on the steep sidewall of the gate electrode 1' by anisotropic etching. The sidewall insulating film and the insulating film 8' deposited immediately before lithography surround the gate electrode 1' to easily maintain electrical insulation between source and drain regions 3 and 4.

Although not shown, after an interlevel insulating film 8''' made of, e.g., silicon oxide, PSG, or BPSG is deposited, wiring contacts are formed by lithography and reactive ion etching, and a silicide such as TiSi or WSi or a metal such as Al or W is deposited to form upper electrode interconnection layers 16, thereby completing a semiconductor structure.

In the seventh embodiment, in addition to the main characteristics and advantages of the first embodiment, the EV source/drain structure is formed from the same single-crystal layer as that for the semiconductor layer 7 without using selective epitaxial growth and semiconductor deposition. This structure is therefore free from any problems ascribed to residual impurities such as oxygen or carbon between the semiconductor layer 7 and the layer 13 during growth or deposition. An excellent interface nearly free from crystal defects such as a stacking fault can be formed. Since the trench 22 is etched with high precision, an EV source/drain can be formed with high precision even with a thick layer 13. Furthermore, if a p-type MISFET is also formed with the same structure as that of an n-type MISFET, a CMOS circuit can be realized without using lithography requiring high positional precision between the source/drain and the gate.

The upper levels of the gate electrode 1' and the layer 15' can be aligned with higher precision than in the first to sixth embodiments, and margins for the precision of contact formation lithography and the etching time can be widened.

In the seventh embodiment, the parasitic resistance R per unit width W of the source/drain regions will be explained with reference to FIGS. 20A and 20B. Letting L be the length from the contact portion of the electrode 16 to the gate sidewall 2, t1 be the thickness of a non-depleted portion of the layer 13 on the assumption that part of the layer 13 is depleted, t2 be the sum of the thicknesses of the layers 14 and 15', ρ1 be the average resistivity of the layer 13, and ρ2 be the average resistivity of the film thicknesses of the layers 14 and 15', R can be approximated at the parallel resistances ρ1L/(Wt1) and ρ2L/(Wt2) of the respective layers by equation (7).

Accordingly, R is shown as in FIG. 20B with its abscissa representing (ρ2/t2)/(ρ1/t1). As is apparent from FIG. 20B, if (ρ2/t2)<(ρ1/t1), R can be decreased to ½ or less, compared to the case in which the source/drain region is formed from only the layer 13. By designing (ρ2/t2) so as to satisfy (ρ2/t2)<(ρ1/t1), and particularly by decreasing the resistivity of the layer 15 stacked on the layer 14, variations caused by the source/drain resistance layer 13 and variations in current drivability can be suppressed.

Figure 27A:
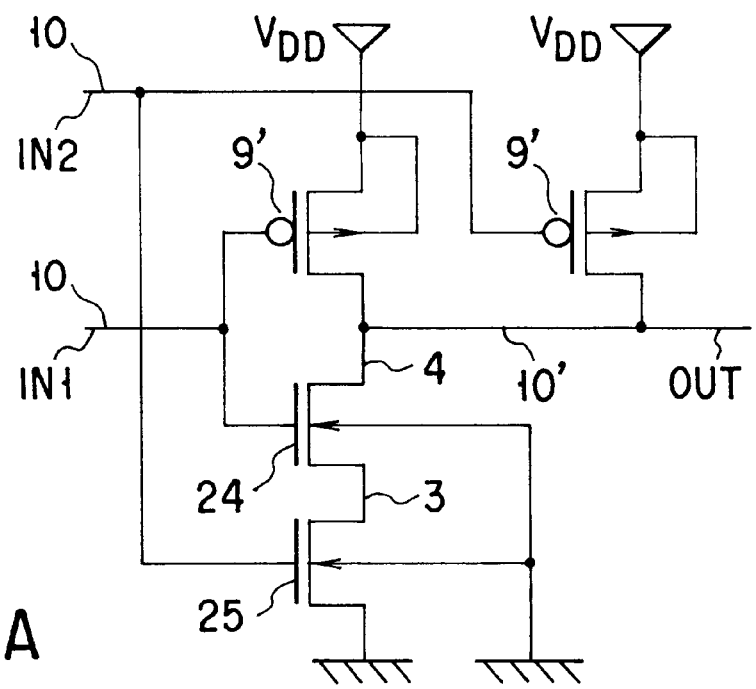
FIGS. 27A and 27B are circuit diagrams, respectively, showing examples of a logic circuit using a MISFET transistor having the structure according to the present invention.
Figure 27B:
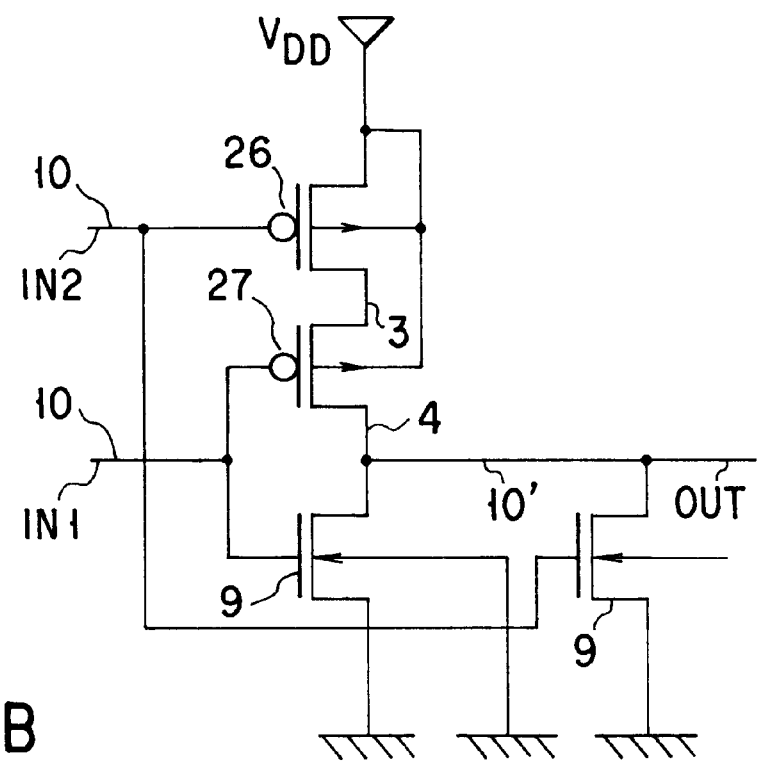

In the structures according to the first to seventh embodiments, since the layer 13 having a higher impurity concentration than that of the layer 14 is formed in the drain region, the position of the channel source edge can be determined with higher precision than in the device shown in FIG. 4A, and the current drivability can be stably obtained even upon an increase in source voltage. FIGS. 27A and 27B show examples of a logic circuit using a MISFET transistor according to the first to seventh embodiment.

FIG. 27A shows an example of a 2-input NAND circuit. An n-type MISFET 24 has the structure according to the present invention, its drain electrode 4 is connected to an output node 10', and its source electrode 3 is connected to the drain electrode of a MISFET 25 of the same conductivity type as that of the MISFET 24. The source electrode of the MISFET 25 is connected to a voltage node at, e.g., 0V. The gate electrode of the MISFET 24 is connected to the gate electrode of a p-type MISFET 9' and serves as the first voltage input terminal (IN1). The gate electrode of the MISFET 25 is connected to the gate electrode of another p-type MISFET 9' and serves as the second voltage input terminal (IN2). The source electrodes of both the p-type MISFETs 9' are connected to a voltage node at, e.g., a voltage $V_{DD}$, and their drain electrodes are connected to the output node 10'. This arrangement represents a 2-input NAND logic circuit in which IN1, IN2, and OUT operate to have voltages corresponding to two logic values around 0V and $V_{DD}$.

In this circuit arrangement, due to a series resistance for the MISFET 25, the voltage of the source electrode of the MISFET 24 rises higher than 0V when the MISFET 25 is turned on at an input voltage of $V_{DD}$. Using the MISFET 24 with the structure according to the present invention can stably realize the high current drivability even upon an increase in source voltage. Accordingly, the output can be changed at a higher speed when the voltage is changed to set both IN2 and IN1 at $V_{DD}$.

FIG. 27B shows an example of a 2-input NOR circuit. A p-type MISFET 27 has the structure according to the present invention, its drain electrode 4 is connected to an output node 10', and its source electrode 3 is connected to the drain electrode of a MISFET 26 of the same conductivity type as that of the MISFET 27. The source electrode of the MISFET 26 is connected to a voltage node at, e.g., $V_{DD}$. The gate electrode of the MISFET 27 is connected to the gate electrode of an n-type MISFET 9 and serves as the first voltage input terminal (IN1). The gate electrode of the MISFET 26 is connected to the gate electrode of another n-type MISFET 9 and serves as the second voltage input terminal (IN2). The source electrodes of both the n-type MISFETs 9 are connected to a voltage node at, e.g., 0V, and their drain electrodes are connected to the output node 10'. This arrangement represents a 2-input NOR logic circuit in which IN1, IN2, and OUT operate to have voltages corresponding to two logic values around 0V and $V_{DD}$.

In this circuit arrangement, due to a series resistances for the MISFET 26, the voltage of the source electrode of the MISFET 27 drops below $V_{DD}$ when the MISFET 26 is turned on at an input voltage of 0V. Using the MISFET 27 with the structure according to the present invention can stably realize the current drivability even upon a decrease in source voltage. Even if the MISFET 26 is series-connected to the MISFET 27 as shown in FIG. 27B, the current drivability is hardly degraded by a decrease in source voltage. The output can therefore be changed at a higher speed when the voltage is changed to set both IN2 and IN1 at 0V.

This feature of small degradation of the current drivability in series connection can be applied to not only the above logic circuit but also, e.g., a dynamic NOR circuit to shorten the output transition time. Further, this feature can also be applied to a memory device built by series-connected transistors, such as a NAND read only memory cell portion or a NAND random access memory cell portion, and a logic device built by series-connected transistors, such as a pass-gate logic circuit, to shorten the read time.

The present invention is not limited to the above-mentioned embodiments. In the embodiments, although the insulating films 2, 8, 27, 21, and 23 are formed by oxide film formation using thermal oxidization, an oxide film may be formed by doping oxygen at a small acceleration energy of about 30 keV, an insulating film may be deposited, a silicon nitride film may be deposited, or a combination of these methods may be used. The element isolation film and the insulating film may be formed by implanting oxygen ions in deposited silicon, or oxidizing deposited silicon, other than a method of converting silicon into a silicon oxide film or silicon nitride film. As this insulating film, a silicon nitride film, a tantalum oxide film, a ferroelectric film such as a strontium titanate film, a barium titanate film, or a lead zirconate titanate film, a single paraelectric film, or a composite film of them can be used.

The embodiments have exemplified trench isolation used as element isolation, but the element isolation may be LOCOS isolation, recessed LOCOS isolation, improved LOCOS isolation, mesa isolation, trench isolation, field-sealed isolation, or a combination of them.

In the embodiments, the semiconductor layer 7 is a p-type Si substrate, but may be an n-type Si substrate, an SOI substrate, a GaAs substrate, or an InP substrate instead. Further, the layers 7, 17, 19, and 13 are desirably single-crystal layers and can be made of single-crystal silicon, an SiGe mixed crystal, or an SiGeC mixed crystal.

The layers 14, 15, and 16 and the gate electrode 1 can be made of single-crystal silicon, polysilicon, porous silicon, amorphous silicon, an SiGe mixed crystal, an SiGeC mixed crystal, a metal such as GaAs, W, Ta, Ti, Hf, Co, Pt, or Pd, a silicide of them, or a stacked structure of them.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having a MISFET, said MISFET comprising:
    a first semiconductor layer of a first conductivity type for forming a channel region;
    a gate electrode facing the channel region via a gate insulating film;
    a second semiconductor layer of a second conductivity type formed in each of source and drain regions so as to be in contact with said first semiconductor layer;
    a third semiconductor layer formed on said second semiconductor layer in the drain region, said second semiconductor layer being sandwiched between said first and third semiconductor layers; and
    first and second main electrodes respectively connected to the source and drain regions,
    wherein an upper edge of said third semiconductor layer is formed above a boundary between said first semiconductor layer and said gate insulating film,
    a value obtained by subtracting a concentration of a first conductivity type impurity from a concentration of a second conductivity type impurity in said second semiconductor layer is set larger than a value obtained by subtracting a concentration of the first conductivity type impurity from a concentration of the second conductivity type impurity in said third semiconductor layer,
    a value obtained by subtracting the concentration of the first conductivity type impurity from the concentration of the second conductivity type impurity in said third semiconductor layer is smaller than a value obtained by subtracting a concentration of the second conductivity type impurity from a concentration of the first conductivity type impurity in said first semiconductor layer, and
    a sidewall insulating film is interposed between said drain region and said gate electrode, and has an outer side surface inclined upward from said gate insulating film to said third semiconductor layer, such that said outer side surface is separated from said gate electrode more on an upper side than on a lower side, and said second and third semiconductor layers each have an end disposed on said outer side surface.

2. A device according to claim 1, further comprising a semiconductor layer equivalent to said third semiconductor layer which is formed on said second semiconductor layer in the source region.

3. A device according to claim 1, wherein said third semiconductor layer is of the second conductivity type.

4. A device according to claim 1, wherein, if $\rho 2$ represents an average resistivity of said third semiconductor layer, $t2$ represents a thickness thereof in a stacking direction, $\rho 1$ represents an average resistivity of said second semiconductor layer, and $t1$ represents a thickness thereof in the stacking direction, $\rho 2/t2 < \rho 1/t1$ holds.

5. A device according to claim 1, further comprising a fourth layer covering an upper surface of said third semiconductor layer, wherein said third semiconductor layer is sandwiched between said second semiconductor layer and said fourth layer, and said fourth layer has a resistivity lower than that of said third semiconductor layer.

6. A device according to claim 1, further comprising a fourth semiconductor layer covering an upper surface of said third semiconductor layer, wherein said third semiconductor layer is sandwiched between said second and fourth semiconductor layers, and a value obtained by subtracting the concentration of the first conductivity type impurity from the concentration of the second conductivity type impurity in said fourth semiconductor layer is set larger than a value obtained by subtracting the concentration of the first conductivity type impurity from the concentration of the second conductivity type impurity in said third semiconductor layer.

7. A device according to claim 1, further comprising a conductive layer in contact with said second and third semiconductor layers, said conductive layer having a resistivity lower than that of said third semiconductor layer.

8. A device according to claim 1, further comprising a lower semiconductor layer of the first conductivity type facing said gate insulating film via said first semiconductor layer, said lower semiconductor layer containing the first conductivity type impurity at a higher concentration than that of said first semiconductor layer.

9. A device according to claim 1, wherein said device comprises a first MISFET mode of said MISFET, and a second MISFET of the same channel type as that of said first MISFET, said second MISFET having a source region connected to a power supply voltage and a drain region connected to the source region of said first MISFET.

10. A device according to claim 1, wherein said gate electrode has a length of not more than 60 nm between said source and drain regions.

11. A device according to claim 1, wherein said second semiconductor layer of each of said source and drain regions terminates before said gate electrode in a direction connecting said source and drain regions.

12. A semiconductor device comprising a MISFET, said MISFET having:
    a first layer of semiconductor of a first conductivity type for forming a channel region;
    a gate electrode facing the channel region via a gate insulating film;
    a second layer of semiconductor of a second conductivity type formed in each of source and drain regions so as to be in contact with said first layer;
    a third layer formed on said second layer in each of the source and drain regions, said second layer being sandwiched between said first and third layers; and
    first and second main electrodes respectively connected to the source and drain regions,
    wherein an upper edge of said third layer is formed above a boundary between said first layer and said gate insulating film,
    in thermal equilibrium, a concentration of second conductivity type carriers in said third layer is lower than a concentration of second conductivity type carriers in said second layer, and is lower than a concentration of first conductivity type carriers in said first layer, and
    a sidewall insulating film is interposed between each of said source and drain regions and said gate electrode, and has an outer side surface inclined upward from said gate insulating film to said third semiconductor layer, such that said outer side surface is separated from said gate electrode more on an upper side, and said second and third semiconductor layers each have an end disposed on said outer side surface.

13. A device according to claim 12, wherein said second and third layers contain a second conductivity type impurity at $10^{18}$ to $10^{21}$ $cm^{-3}$ and $10^{16}$ to $10^{18}$ $cm^{-3}$, respectively.

14. A device according to claim 12, wherein, if $\rho 2$ represents an average resistivity of said third layer, $t2$ represents a thickness thereof in a stacking direction, $\rho 1$ represents an average resistivity of said second layer, and $t1$ represents a thickness thereof in the stacking direction, $\rho 2/t2 < \rho 1/t1$ holds.

15. A device according to claim 12, further comprising a fourth layer covering an upper surface of said third layer, wherein said third layer is sandwiched between said second layer and said fourth layer, and said fourth layer has a resistivity lower than that of said third layer.

16. A device according to claim 12, further comprising a fourth layer of semiconductor covering an upper surface of said third layer, wherein said third layer is sandwiched between said second and fourth layers, and said fourth layer contains a second conductivity type impurity at a higher concentration than that of said third layer.

17. A device according to claim 12, further comprising a conductive layer in contact with said second and third layers, said conductive layer having a resistivity lower than that of said third layer.

18. A device according to claim 12, further comprising a lower semiconductor layer of the first conductivity type facing said gate insulating film via said first layer, said lower semiconductor layer containing a first conductivity type impurity at a higher concentration than that of said first layer.

19. A device according to claim 12, wherein said device comprises a first MISFET made of said MISFET, and a second MISFET of the same conductivity type as that of said first MISFET, said second MISFET having a source region connected to a power supply voltage and a drain region connected to the source region of said first MISFET.

20. A device according to claim 19, wherein said first and second MISFETs are n-channel transistors that are series-connected to form a NAND logic circuit.

21. A device according to claim 19, wherein said first and second MISFETs are p-channel transistors that are series-connected to form a NOR logic circuit.

22. A device according to claim 12, wherein said gate electrode has a length of not more than 60 nm between said source and drain regions.

23. A device according to claim 12, wherein said second semiconductor layer of each of said source and drain regions terminates before said gate electrode in a direction connecting said source and drain regions.

24. A semiconductor device having a MISFET, said MISFET comprising:

a first semiconductor layer of a first conductivity type for forming a channel region;

a gate electrode facing the channel region via a gate insulating film;

a second semiconductor layer of a second conductivity type formed in each of source and drain regions so as to be in contact with said first semiconductor layer;

a third semiconductor layer of the second conductivity type formed on said second semiconductor layer in each of the source and drain regions, said second semiconductor layer being sandwiched between said first and third semiconductor layers; and first and second main electrodes respectively connected to the source and drain regions, wherein an upper edge of said third semiconductor layer is formed above a boundary between said first semiconductor layer and said gate insulating film, and in thermal equilibrium, a concentration of second conductivity type carriers in said third layer is lower than a concentration of second conductivity type carriers in said second layer, and is lower than a concentration of first conductivity type carriers in said first layer, and a sidewall insulating film is interposed between each of said source and drain regions and said gate electrode, and has an outer side surface inclined upward from said gate insulating film to said third semiconductor layer, such that said outer side surface is separated from said gate electrode more on an upper side, and said second and third semiconductor layers each have an end disposed on said outer side surface, said gate electrode has a length of not more than 60 nm between said source and drain regions, and said second semiconductor layer of each of said source and drain regions terminates before said gate electrode in a direction so as to electrically connect said source and drain regions.

25. A device according to claim 24, wherein, in an ON state, a depletion layer in the drain region is formed to extend into said third semiconductor layer, and a depletion layer in the source region is formed to extend into said second semiconductor layer.

* * * * *

UNITED STATES PATENT AND TRADEMARK OFFICE
CERTIFICATE OF CORRECTION

PATENT NO. : 6,323,525 B1
DATED : November 27, 2001
INVENTOR(S) : Mitsuhiro Noguchi et al.

It is certified that error appears in the above-identified patent and that said Letters Patent is hereby corrected as shown below:

<u>Column 26,</u>
Line 18, "mode" should read -- made --.

Signed and Sealed this

Twenty-first Day of May, 2002

Attest:

JAMES E. ROGAN
*Director of the United States Patent and Trademark Office*

*Attesting Officer*